(12) United States Patent
Kaji et al.

(10) Patent No.: US 7,307,503 B2
(45) Date of Patent: Dec. 11, 2007

(54) THIN FILM COIL, METHOD OF MANUFACTURING THE SAME, COIL STRUCTURE, AND METHOD OF MANUFACTURING THE SAME

(75) Inventors: Rina Kaji, Chuo-ku (JP); Akifumi Kamijima, Chuo-ku (JP); Susumu Aoki, Chuo-ku (JP); Kenji Takeo, Chuo-ku (JP); Yoshikazu Sato, Chuo-ku (JP)

(73) Assignee: TDK Corporation, Tokyo (JP)

( * ) Notice: Subject to any disclaimer, the term of this patent is extended or adjusted under 35 U.S.C. 154(b) by 74 days.

(21) Appl. No.: 11/156,526

(22) Filed: Jun. 21, 2005

(65) Prior Publication Data

US 2006/0001520 A1 Jan. 5, 2006

(30) Foreign Application Priority Data

Jul. 1, 2004 (JP) ............................. 2004-195779

(51) Int. Cl.
*H01F 5/00* (2006.01)
(52) U.S. Cl. ................... 336/200; 336/223; 336/232
(58) Field of Classification Search ............ 336/200, 336/223, 232
See application file for complete search history.

(56) References Cited

U.S. PATENT DOCUMENTS 5,065,270 A * 11/1991 Koyanagi et al. .......... 360/123
5,896,078 A * 4/1999 Hayakawa et al. ......... 336/200
6,717,502 B2 * 4/2004 Yue ........................... 336/200
6,831,543 B2 * 12/2004 Mizoguchi et al. ......... 336/200
6,838,970 B2 * 1/2005 Basteres et al. ............ 336/200

FOREIGN PATENT DOCUMENTS

| JP | A-7-272934 | 10/1995 |
| JP | A-9-153406 | 6/1997 |
| JP | A 2002-110423 | 4/2002 |
| JP | A 2003-133135 | 5/2003 |

* cited by examiner

*Primary Examiner*—Anh Mai
(74) *Attorney, Agent, or Firm*—Oliff & Berridge, PLC

(57) ABSTRACT

The present invention provides a coil structure capable of improving a differential transmission characteristic by reducing capacitance as much as possible. A common mode choke coil is constructed so that a section of each of two coil patterns constructing a thin film coil has an inverted trapezoid shape which is bilaterally asymmetrical. Because of the structural characteristic that the section of each of the two coil patterns has an inverted trapezoid shape which is bilaterally asymmetrical, the facing area of the two coil patterns contributing to capacitance is minimized. Thus, the capacitance of the thin film coil can be reduced as much as possible.

5 Claims, 18 Drawing Sheets

THIN FILM COIL, METHOD OF MANUFACTURING THE SAME, COIL STRUCTURE, AND METHOD OF MANUFACTURING THE SAME

BACKGROUND OF THE INVENTION

1. Field of the Invention

The present invention relates to a thin film coil including two coil patterns turned spirally in parallel with each other, a method of manufacturing the same, a coil structure having the thin film coil, and a method of manufacturing the same.

2. Description of the Related Art

In recent years, in the information communication field and the like, a common mode choke coil is spread as a coil part for reducing noise in a high frequency band. For example, the common mode choke coil is used for preventing noise of a radio broadcast or the like from coming into a telephone line.

The common mode choke coil has a configuration that, mainly, a thin film coil is buried between two magnetic substrates via an insulating layer. The thin film coil is generally constructed by including a coil pattern turned spirally. Examples of known common mode choke coils are a common mode choke coil including a thin film coil having a double turn structure in which two coil patterns are wound in parallel with each other at the same level (refer to, for example, Japanese Patent Laid-open No. 2002-110423) and a common mode choke coil including a thin film coil having a stacked structure that two coil patterns are stacked in different levels (refer to, for example, Japanese Patent Laid-open No. 2003-133135).

To improve the operation characteristic of the common mode choke coil, for example, for the purpose of improving the differential transmission (balance transmission) characteristic, it is necessary to reduce the capacitance (floating capacitance) between turns of a thin film coil (coil patterns).

More concretely, the capacitance generally depends on the inductance of the thin film coil. Consequently, when relatively large capacitance is generated, the capacitance becomes dominant in a high frequency band with respect to the impedance of the common mode choke coil. Therefore, when considering the fact that the impedance by the capacitance is inversely proportional to the frequency, as the capacitance increases, the impedance decreases and it causes deterioration in the differential transmission characteristic. It is consequently necessary to reduce the capacitance in order to improve the differential transmission characteristic.

However, in a conventional common mode choke coil, although it is necessary to reduce the capacitance as much as possible in order to improve the differential transmission characteristic, it is difficult to sufficiently reduce the capacitance mainly due to a structural factor of a thin film coil (coil patterns) and there is still room for improvement in reduction in the capacitance. Therefore, to improve the differential transmission characteristic of the common mode choke coil, it is urgently necessary to establish a technique capable of reducing the capacitance as much as possible. In the case of establishing a technique of this kind, it is particularly important that the common mode choke coil can be manufactured as easily as possible for mass production of the common mode choke coil.

SUMMARY OF THE INVENTION

The present invention has been achieved in consideration of such problems and its first object is to provide a thin film coil capable of contributing to improvement in the differential transmission characteristic.

A second object of the invention is to provide a coil structure capable of improving the differential transmission characteristic by reducing the capacitance as much as possible.

A third object of the invention is to provide a thin film coil manufacturing method capable of manufacturing a thin film coil of the invention as easy as possible.

A fourth object of the invention is to provide a coil structure manufacturing method capable of manufacturing a coil structure of the invention as easy as possible.

A thin film coil according to the invention includes a first coil pattern and a second coil pattern which are provided on a predetermined underlayer and turn spirally in parallel with each other around a predetermined center position. Each of a section of the first coil pattern and a section of the second coil pattern has a trapezoid shape having one side positioned on the side far from the underlayer and specifying two base angles as a longer one of a set of opposite sides which are parallel to each other and the other side positioned on the side close to the underlayer as a shorter one of the set of opposite sides.

In the thin film coil according to the invention, each of a section of the first coil pattern and a section of the second coil pattern has a trapezoid shape having one side positioned on the side far from the underlayer and specifying two base angles as a longer one of a set of opposite sides which are parallel to each other and the other side positioned on the side close to the underlayer as a shorter one of the set of opposite sides. Consequently, the facing areas of the two coil patterns contributing to capacitance are minimized and the electric resistance (direct current resistance) is minimized.

In a coil structure according to the invention, the thin film coil of the invention is buried between two magnetic substrates via an insulating layer.

Since the coil structure according to the invention includes the thin film coil of the invention, as described above, the facing areas of the two coil patterns contributing to capacitance are minimized and the electric resistance (direct current resistance) is minimized.

According to a first aspect of the invention, a method of manufacturing a thin film coil including a first coil pattern and a second coil pattern which are provided on a predetermined underlayer and turn spirally in parallel with each other around a predetermined center position is provided. In the method, a process of forming the first and second coil patterns comprises: a first step of forming a photoresist on the underlayer; a second step of forming a photoresist pattern by selectively exposing and patterning the photoresist while controlling progress in an exposing process so that the photoresist pattern has a first opening for forming the first coil pattern and a second opening for forming the second coil pattern and each of width of the first opening and width of the second opening gradually decreases toward the underlayer; a third step of forming the first and second coil patterns in the first and second openings, respectively, in the photoresist pattern so that each of a section of the first coil pattern and a section of the second coil pattern has a trapezoid shape including one side which is positioned on the side far from the underlayer and specifies two base angles as a longer one of a set of opposite sides which are parallel to each other and the other side positioned on the side close to the underlayer as a shorter one of the set of opposite sides; and a fourth step of removing the used photoresist pattern.

In the method of manufacturing a thin film coil according to the first aspect of the invention, a photoresist pattern is selectively exposed and patterned while controlling progress in an exposing process, thereby forming the photoresist pattern so that each of width of the first opening and width of the second opening gradually decreases toward the underlayer and, after that, the first and second coil patterns are formed in the first and second openings, respectively, in the photoresist pattern. As a result, each of a section of the first coil pattern and a section of the second coil pattern has an inverted trapezoid shape (a trapezoid shape including one side which is positioned on the side far from the underlayer and specifies two base angles as a longer one of a set of opposite sides which are parallel to each other and the other side positioned on the side close to the underlayer as a shorter one of the set of opposite sides). Since only the existing thin film process is used for forming both of the first and second coil patterns each having the section of the inverted trapezoid shape, the thin film coil can be formed easily.

According to a second aspect of the invention, a method of manufacturing a thin film coil including a first coil pattern and a second coil pattern which are provided on a predetermined underlayer and turn spirally in parallel with each other around a predetermined center position is provided. In the method, a process of forming the first and second coil patterns comprises: a first step of, on the underlayer on which a photoresist pattern having a first inner frame part and a first outer frame part disposed so as to face each other, thereby defining a first opening for forming the first coil pattern, and a second inner frame part and a second outer frame part disposed so as to face each other, thereby defining a second opening for forming the second coil pattern is to be formed, patterning a first exposure control layer for controlling progress of an exposing process so as to be formed in either a first inner area which is positioned on the side close to the center position and in which the first inner frame part is to be formed or a first outer area which is positioned on the side far from the center position and in which the first outer frame part is to be formed, and patterning a second exposure control layer for controlling progress of the exposing process so as to be formed in either a second inner area which is positioned on the side close to the center position and in which the second inner frame part is to be formed or a second outer area which is positioned on the side far from the center position and in which the second outer frame part is to be formed; a second step of forming a photoresist so as to cover the underlayer, the first exposure control layer, and the second exposure control layer; a third step of forming the first and second openings by patterning the photoresist by selective exposure, thereby forming the photoresist pattern on the underlayer so that the photoresist pattern has the first inner frame part disposed in the first inner area, the first outer frame part disposed in the first outer area, the second inner frame part disposed in the second inner area, and the second outer frame part disposed in the second outer area, width of each of the first opening and the second opening gradually decreases toward the underlayer, an inclination angle of a first inner-side defining face defining the first opening in the first inner frame part and an inclination angle of a first outer-side defining face defining the first opening in the first outer frame part are different from each other, and an inclination angle of a second inner-side defining face defining the second opening in the second inner frame part and an inclination angle of a second outer-side defining face defining the second opening in the second outer frame part are different from each other; a fourth step of forming the first and second coil patterns in the first and second openings, respectively, in the photoresist pattern so that each of a section of the first coil pattern and a section of the second coil pattern has a trapezoid shape including one side which is positioned on the side far from the underlayer and specifies two base angles as a longer one of a set of opposite sides which are parallel to each other and the other side positioned on the side close to the underlayer as a shorter one of the set of opposite sides, and the section of the first coil pattern and the section of the second coil pattern become the same; and a fifth step of removing the photoresist pattern and the first and second exposure control layers used.

In the method of manufacturing a thin film coil according to the second aspect of the invention, a photoresist pattern is selectively exposed and patterned while varying the exposure range between the first inner area and the first outer area in accordance with the presence or absence of the first exposure control layer and varying the exposure range between the second inner area and the second outer area in accordance with the presence or absence of the second exposure control layer, thereby forming the photoresist pattern so that each of width of the first opening and width of the second opening gradually decreases toward the underlayer and, after that, the first and second coil patterns are formed in the first and second openings, respectively, in the photoresist pattern. As a result, each of a section of the first coil pattern and a section of the second coil pattern has an inverted trapezoid shape which is bilaterally asymmetrical (a trapezoid shape including one side which is positioned on the side far from the underlayer and specifies two base angles as a longer one of a set of opposite sides which are parallel to each other and the other side positioned on the side close to the underlayer as a shorter one of the set of opposite sides), and the section of the first coil pattern and that of the second coil pattern become the same. Since only the existing thin film process is used for forming both of the first and second coil patterns each having the section of the inverted trapezoid shape which is bilaterally asymmetrical, the thin film coil can be formed easily.

According to a third aspect of the invention, a method of manufacturing a thin film coil including a first coil pattern and a second coil pattern which are provided on a predetermined underlayer and turn spirally in parallel with each other around a predetermined center position is provided. In the method, a process of forming the first and second coil patterns comprises: a first step of, on the underlayer on which a photoresist pattern having a first inner frame part and a first outer frame part disposed so as to face each other, thereby defining a first opening for forming the first coil pattern, and a second inner frame part and a second outer frame part disposed so as to face each other, thereby defining a second opening for forming the second coil pattern is to be formed, patterning an exposure control layer for controlling progress of an exposing process so as to be formed in both of a first inner area which is positioned on the side close to the center position and in which the first inner frame part is to be formed and a first outer area which is positioned on the side far from the center position and in which the first outer frame part is to be formed, or in both of a second inner area which is positioned on the side close to the center position and in which the second inner frame part is to be formed and a second outer area which is positioned on the side far from the center position and in which the second outer frame part is to be formed; a second step of forming a photoresist so as to cover the underlayer and the exposure control layer; a third step of forming the first and second openings by patterning the photoresist by selective exposure, thereby forming the photoresist pattern on the underlayer so that the photoresist pattern has the first inner frame part disposed in the first inner area, the first outer frame part disposed in the first outer area, the second inner frame part disposed in the second inner area, and the second outer frame part disposed in the second outer area, width of each of the first opening and the second opening gradually decreases toward the underlayer, an inclination angle of a first inner-side defining face defining the first opening in the first inner frame part and an inclination angle of a first outer-side defining face defining the first opening in the first outer frame part are equal to each other, and an inclination angle of a second inner-side defining face defining the second opening in the second inner frame part and an inclination angle of a second outer-side defining face defining the second opening in the second outer frame part are equal to each other; a fourth step of forming the first and second coil patterns in the first and second openings, respectively, in the photoresist pattern so that each of a section of the first coil pattern and a section of the second coil pattern has a trapezoid shape including one side which is positioned on the side far from the underlayer and specifies two base angles as a longer one of a set of opposite sides which are parallel to each other and the other side positioned on the side close to the underlayer as a shorter one of the set of opposite sides, and the section of the first coil pattern and the section of the second coil pattern are different from each other; and a fifth step of removing the photoresist pattern and the exposure control layers used.

In the method of manufacturing a thin film coil according to the third aspect of the invention, a photoresist pattern is selectively exposed and patterned while varying the exposure range between the first inner area and the first outer area and the second inner area and the second outer area in accordance with the presence or absence of the exposure control layer, thereby forming the photoresist pattern so that each of width of the first opening and width of the second opening gradually decreases toward the underlayer and, after that, the first and second coil patterns are formed in the first and second openings, respectively, in the photoresist pattern. As a result, each of a section of the first coil pattern and a section of the second coil pattern has an inverted trapezoid shape which is bilaterally symmetrical (a trapezoid shape including one side which is positioned on the side far from the underlayer and specifies two base angles as a longer one of a set of opposite sides which are parallel to each other and the other side positioned on the side close to the underlayer as a shorter one of the set of opposite sides), and the section of the first coil pattern and that of the second coil pattern become different from each other. Since only the existing thin film process is used for forming both of the first and second coil patterns each having the section of the inverted trapezoid shape which is bilaterally symmetrical, the thin film coil can be formed easily.

The invention also provides a method of manufacturing a coil structure in which a thin film coil is buried between two magnetic substrates via an insulating layer and the method includes a step of forming the thin film coil so as to be buried between the two magnetic substrates via the insulating layer by using the method of manufacturing a thin film coil according to the invention.

In the method of manufacturing a coil structure according to the invention, a thin film coil is formed by using the method of manufacturing a thin film coil of the invention. Thus, only an existing thin film process is used for forming the thin film coil, and the thin film coil is formed easily.

In the thin film coil according to the invention, based on the structural characteristic that a section of each of the first and second coil patterns constructing the thin film coil has the inverted trapezoid shape, the facing areas of the two coil patterns contributing to capacitance are minimized and the electric resistance (direct current resistance) is minimized. Therefore, the invention can contribute to improve the differential transmission characteristic.

In the coil structure according to the invention, based on the structural characteristic that the coil structure has the thin film coil of the invention, the facing areas of the two coil patterns contributing to capacitance are minimized and the electric resistance (direct current resistance) is minimized. Therefore, the invention can improve the differential transmission characteristic by minimizing the capacitance.

In the method of manufacturing a thin film coil according to the first aspect of the invention, a photoresist pattern is selectively exposed and patterned while controlling progress in an exposing process, thereby forming the photoresist pattern so that each of width of the first opening and width of the second opening gradually decreases toward the underlayer and, after that, the first and second coil patterns are formed in the first and second openings, respectively, in the photoresist pattern. On the basis of the characteristic of the manufacturing method, only the existing thin film process is used for forming both of the first and second coil patterns each having the section of the inverted trapezoid shape, so that the thin film coil of the invention can be formed easily.

In the method of manufacturing a thin film coil according to the second aspect of the invention, a photoresist pattern is selectively exposed and patterned while varying the exposure range between the first inner area and the first outer area in accordance with the presence or absence of the first exposure control layer and varying the exposure range between the second inner area and the second outer area in accordance with the presence or absence of the second exposure control layer, thereby forming the photoresist pattern so that each of width of the first opening and width of the second opening gradually decreases toward the underlayer and, after that, the first and second coil patterns are formed in the first and second openings, respectively, in the photoresist pattern. On the basis of the manufacturing method characteristic, only the existing thin film process is used for forming both of the first and second coil patterns each having the section of the inverted trapezoid shape which is bilaterally asymmetrical, the thin film coil of the invention can be formed as easy as possible.

In the method of manufacturing a thin film coil according to the third aspect of the invention, a photoresist pattern is selectively exposed and patterned while varying the exposure range between the first inner area and the first outer area and the second inner area and the second outer area in accordance with the presence or absence of the exposure control layer, thereby forming the photoresist pattern so that each of width of the first opening and width of the second opening gradually decreases toward the underlayer and, after that, the first and second coil patterns are formed in the first and second openings, respectively, in the photoresist pattern. On the basis of the manufacturing method characteristic, only the existing thin film process is used for forming both of the first and second coil patterns each having the section of the inverted trapezoid shape which is bilaterally symmetrical, the thin film coil of the invention can be formed as easy as possible.

In the method of manufacturing a coil structure according to the invention, on the basis of the manufacturing method characteristic that a thin film coil is formed by using the method of manufacturing a thin film coil of the invention, only an existing thin film process is used for forming the thin film coil. Thus, the coil structure of the invention can be manufactured as easy as possible.

Other and further objects, features and advantages of the invention will appear more fully from the following description.

DETAILED DESCRIPTION OF THE PREFERRED EMBODIMENTS

Embodiments of the invention will be described in detail hereinbelow with reference to the drawings.

First Embodiment

Figure 1:
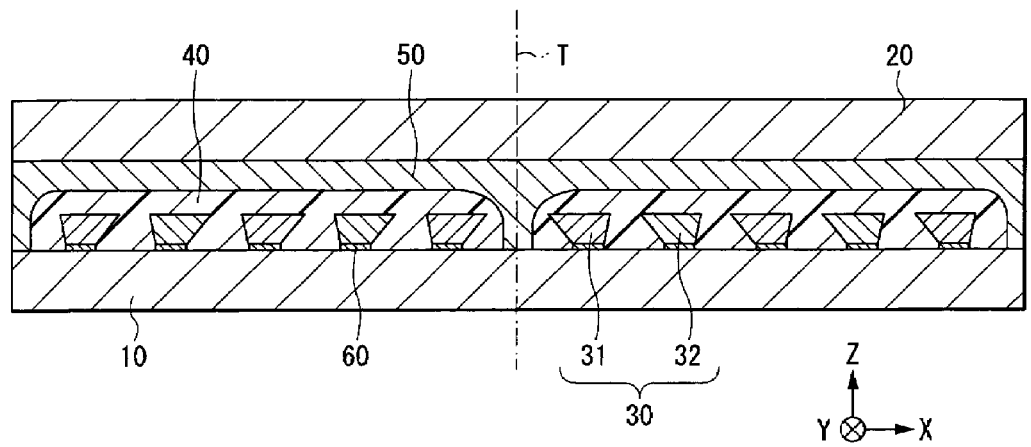
FIG. 1 is a cross section schematically showing a sectional configuration of a common mode choke coil according to a first embodiment of the invention.

First, the configuration of a common mode choke coil as a "coil structure" according to a first embodiment of the invention will be described with reference to FIG. 1. FIG. 1 schematically shows a sectional configuration of a common mode choke coil. Since a "thin film coil" of the invention is a component of the common mode choke coil, the thin film coil will be also described hereinbelow.

The common mode choke coil is used for, for example, reducing noise in a high frequency band and has a configuration that, as shown in FIG. 1, a thin film coil 30 is buried between two magnetic substrates as magnetic base bodies, specifically, a bottom magnetic substrate 10 and a top magnetic substrate 20 via an insulating layer 40, a magnetic layer 50, and a seed layer 60.

Each of the bottom and top magnetic substrates 10 and 20 is made of a magnetic material such as nickel iron alloy (NiFe (for example, Ni: 80% by weight and Fe: 20% by weight) which is so-called "Permalloy (trade name)") and has a thickness of about 1.0 μm to 10.0 μm.

The thin film coil 30 generates a magnetic flux when energized, and is disposed on a predetermined under layer (the seed layer 60) so as to be buried by the insulating layer 40. The thin film coil 30 includes two coil patterns 31 and 32 (first and second coil patterns). Each of the coil patterns 31 and 32 is made of, for example, a high conductive material such as copper (Cu). The detailed configuration of the thin film coil 30 (the coil patterns 31 and 32) will be described later (refer to FIGS. 2 and 3).

The insulating layer 40 is provided to electrically insulate the thin film coil 30 from the periphery and is disposed, for example, so as to cover the thin film coil 30 and its peripheral area in a ring shape on the bottom magnetic substrate 10. The insulating layer 40 is made of, for example, an insulating material of a photoresist or the like.

The magnetic layer 50 is used to magnetically couple the bottom magnetic substrate 10 and the top magnetic substrate 20 and is disposed, for example, over the bottom magnetic substrate 10 so as to cover the insulting layer 40 and its peripheral area. The magnetic layer 50 is made of, for example, a composite magnetic material (composite ferrite) in which magnetic powders of magnesium-zinc (Mg—Zn) based ferrite and high polymers of polyimide or the like are mixed.

The seed layer 60 is used to form the thin film coil 30 (coil patterns 31 and 32) by using a plating process and is patterned between the bottom magnetic substrate 10 and the thin film coil 30. The seed layer 60 is made of, for example, a material similar to that of the thin film coil 30.

Figure 2:
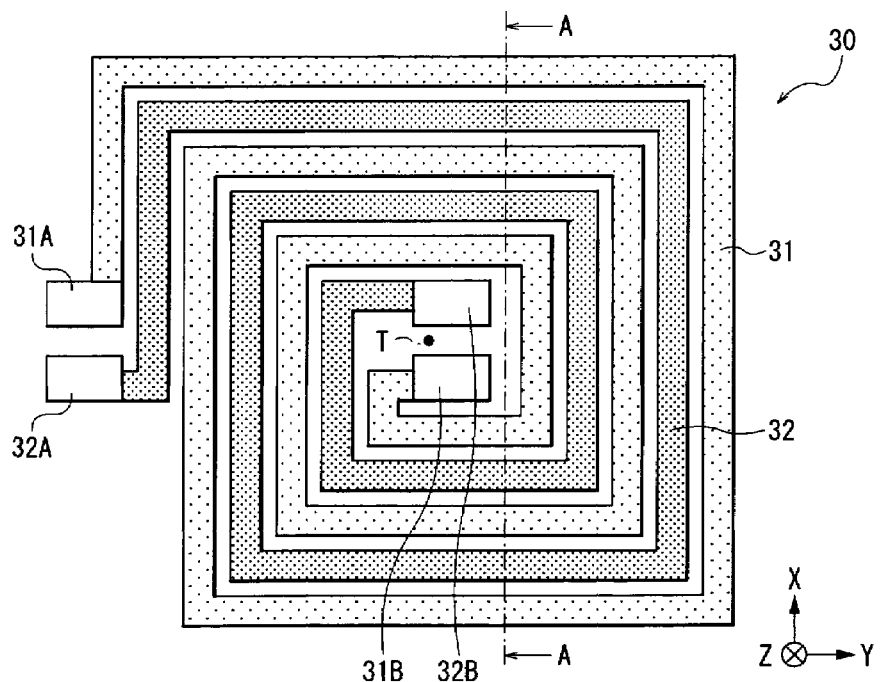
FIG. 2 is a plan view showing a configuration of a thin film coil.
Figure 3:
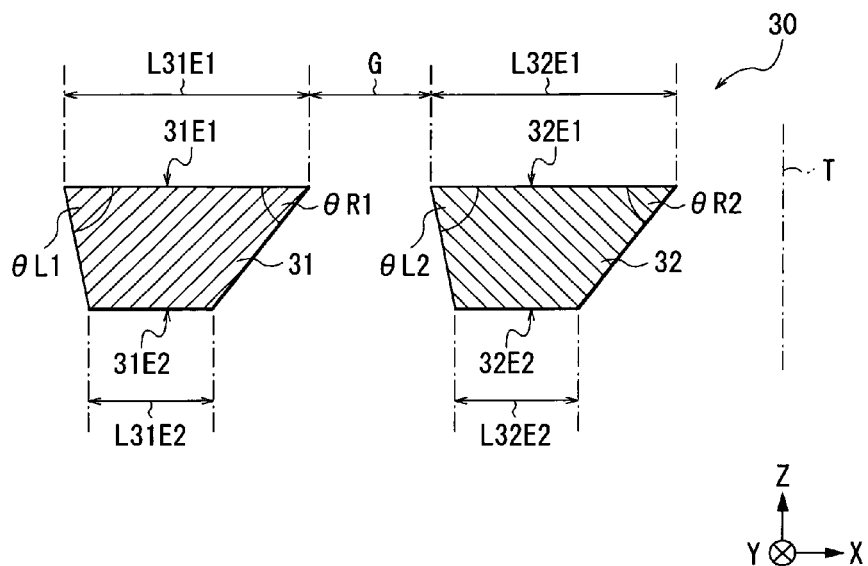
FIG. 3 is a partially enlarged cross section showing a sectional configuration of the thin film coil.

The detailed configuration of the thin film coil 30 will now be described with reference to FIGS. 1 to 3. FIG. 2 shows the configuration in plan view of the thin film coil 30 (coil patterns 31 and 32). FIG. 3 is a partially enlarged view of a sectional configuration of the thin film coil 30 (coil patterns 31 and 32). FIG. 1 is a cross section taken along line A-A of FIG. 2.

The coil patterns 31 and 32 constructing the thin film coil 30 are turned in a spiral shape in parallel with each other around a predetermined center position T as shown in FIG. 2. The coil patterns 31 and 32 have a parallel relation such that the coil pattern 31 is positioned relatively on the outside and the coil pattern 32 is positioned relatively on the inside. In other words, the thin film coil 30 has a double-winding structure constructed by the coil patterns 31 and 32. For confirmation, the configuration that "the coil patterns 31 and 32 are in parallel with each other" denotes that the coil patterns 31 and 32 are not disposed so as to be stacked in the height direction (the direction perpendicular to the sheet face of FIG. 2 or the Z axis direction), that is, are not disposed in different levels but are disposed in parallel with each other (the in-plane direction of the sheet face of FIG. 2 or the XY in-plane direction), that is, are disposed in the same level.

A terminal for current passage is provided for each of the ends of the coil patterns 31 and 32. Terminals 31A and 31B are provided for the outer and inner ends of the coil pattern 31, and terminals 32A and 32B are provided for the outer and inner ends of the coil pattern 32. The number of turns of the coil patterns 31 and 32 shown in FIG. 2 is just an example and can be freely changed. Particularly, in FIG. 2, to distinguish the coil patterns 31 and 32 from each other, the coil pattern 31 is lightly meshed and the coil pattern 32 is darkly meshed.

The section of each of the coil patterns 31 and 32 has an inverted trapezoid shape as shown in FIGS. 1 and 3. Specifically, the section of the coil pattern 31 has a trapezoid shape (inverted trapezoid shape) including a edge 31E1 positioned on the side far from the seed layer 60 and specifying two base angles (an inner-side base angle $\theta R1$ and an outer-side base angle $\theta L1$) as a longer one of a set of opposite sides which are parallel to each other, and the other edge 31E2 positioned on the side close to the seed layer 60 as a shorter one of the set of opposite sides. Similarly, the section of the coil pattern 32 has a trapezoid shape (inverted trapezoid shape) including a edge 32E1 positioned on the side far from the seed layer 60 and specifying two base angles (an inner-side base angle $\theta R2$ and an outer-side base angle $\theta L2$) as a longer one of a set of opposite sides which are parallel to each other, and the other edge 32E2 positioned on the side close to the seed layer 60 as a shorter one of the set of opposite sides.

Particularly, in an arbitrary winding position, the section of the coil pattern 31 and that of the coil pattern 32 match each other as shown in FIG. 3. More concretely, the section of each of the coil patterns 31 and 32 has an inverted-trapezoid shape which is asymmetrical bilaterally. To be specific, in the section of the coil pattern 31, for example, out of the two base angles (the inner-side base angle $\theta R1$ and the outer-side base angle $\theta L1$), the inner-side base angle $\theta R1$ (first inner-side base angle) positioned on the side close to the center position T and the outer-side base angle $\theta L1$ (first outer-side base angle) positioned on the side far from the center position T are different from each other ($\theta R1 \neq \theta L1$). In this case, the outer-side base angle $\theta L1$ is larger than the inner-side base angle $\theta R1$ ($\theta R1 < \theta L1$). Similarly, in the section of the coil pattern 32, for example, out of the two base angles (the inner-side base angle $\theta R2$ and the outer-side base angle $\theta L2$), the inner-side base angle $\theta R2$ (second inner-side base angle) positioned on the side close to the center position T and the outer-side base angle $\theta L2$ (second outer-side base angle) positioned on the side far from the center position T are different from each other ($\theta R2 \neq \theta L2$). In this case, the outer-side base angle $\theta L2$ is larger than the inner-side base angle $\theta R2$ ($\theta R2 < \theta L2$).

As an example of concrete dimensions in the case of FIG. 3, the length L31E1 of the edge 31E1=the length L32E1 of the edge 32E1=about 20 μm, the length L31E2 of the edge 31E2=the length L32E2 of the edge 32E2=about 13 μm, each of the inner-side base angles $\theta R1$ and $\theta R2$=about 60°, each of the outer-side base angles $\theta L1$ and $\theta L2$=about 85°, and the interval G between the turns=about 5 μm.

The operations of the common mode choke coil will now be described with reference to FIGS. 1 to 3.

In the common mode choke coil, when current is passed to the thin film coil 30, specifically, when current flows in the coil pattern 31 via the terminals 31A and 31B and current flows in the coil pattern 32 via the terminals 32A and 32B, a magnetic flux is generated in each of the coil patterns 31 and 32. When the in-phase current is passed to the coil patterns 31 and 32, the magnetic fluxes generated in the coil patterns 31 and 32 are combined so that impedance increases. In contrast, when the negative-phase current is passed to the coil patterns 31 and 32, the magnetic fluxes generated in the coil patterns 31 and 32 cancel out each other, so that the impedance does not increase. By using the principle, in the common mode choke coil, according to the presence or absence of the increase in the impedance, when the in-phase current flows, current does not easily flow and when the negative-phase current flows, current easily flows. That is, an electric filter function is obtained. Consequently, by using the electric filter function, noise can be electrically reduced.

In the common mode choke coil according to the embodiment, the section of each of the two coil patterns 31 and 32 constructing the thin film coil 30 has the inverted-trapezoid shape which is bilaterally asymmetrical. Consequently, by reducing the capacitance as much as possible, the differential transmission characteristic can be improved for the following reason.

With respect to the common mode choke coil including the thin film coil having the double-winding structure, when the dielectric constant between the two coil patterns (the dielectric constant of the insulating layer burying the two coil patterns) is $\epsilon$, a facing area of the two coil patterns (the area where the coil patterns in parallel with each other face each other) is S, and the interval between the two coil patterns is D, the capacitance C is expressed by a relational expression of $C = \epsilon \times (S/D)$. To improve the differential transmission characteristic of the common mode choke coil, the capacitance C has to be reduced as much as possible. With respect to this point, in the embodiment, the section of each of the two coil patterns 31 and 32 has the inverted trapezoid shape which is bilaterally asymmetrical, that is, the section of the two coil patterns 31 and 32 is a combination of the inverted trapezoid shapes each of which is bilaterally asymmetrical. Based on the relational expression of the capacitance C, when the dielectric constant $\epsilon$ and the interval D are constant, the facing area S is smaller than that in any of the cases where the section of the two coil patterns is a combination of rectangular shapes, a combination of an inverted trapezoid and a rectangular shape, and a combination of an inverted trapezoid and a trapezoid. Moreover, in the embodiment, based on the structural characteristic that the section of each of the two coil patterns 31 and 32 has the inverted trapezoid shape which is bilaterally asymmetrical, the sectional area of the coil patterns 31 and 32 becomes the maximum. Consequently, while reducing the facing area S of the coil patterns 31 and 32 as much as possible, the electric resistance (direct current resistance) is minimized. Therefore, in the embodiment, by reducing the capacitance as much as possible, the differential transmission characteristic can be improved.

Particularly, in the embodiment, as shown in FIG. 3, in the sections of both of the coil patterns 31 and 32, the outer-side base angles $\theta L1$ and $\theta L2$ positioned on the side far from the center position T are set to be larger than the inner-side base angles $\theta R1$ and $\theta R2$ positioned on the side close to the center position T ($\theta R1$, $\theta R2 < \theta L1$, $\theta L2$). Consequently, in both of the coil patterns 31 and 32, the inner face close to the center position T is inclined more largely than the outer face on the side far from the center position T. In this case, the sectional area on the side far from the center position T (the side where a current path is relatively long) is larger than that on the side close to the center position T in each of the coil patterns 31 and 32, so that the direct current resistance of the thin film coil 30 can be reduced.

In addition, in the thin film coil 30 according to the embodiment, since the section of each of the coil patterns 31 and 32 has the inverted trapezoid shape which is bilaterally asymmetrical, as described above, the capacitance is reduced as much as possible because of the shapes of the sections of the coil patterns 31 and 32. Therefore, by constructing the common mode choke coil by using the thin film coil 30, it can contribute to improvement in the differential transmission characteristic.

Figure 6:
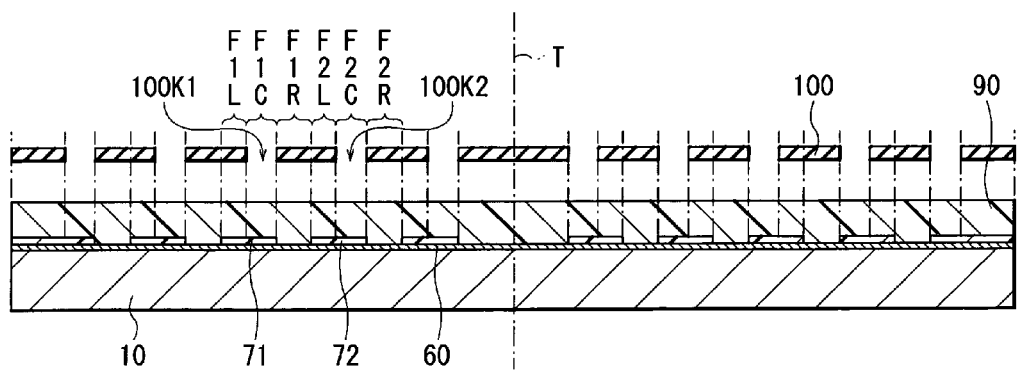
FIG. 6 is a cross section for explaining a process subsequent to FIG. 5.
Figure 6:
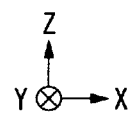
Figure 7:
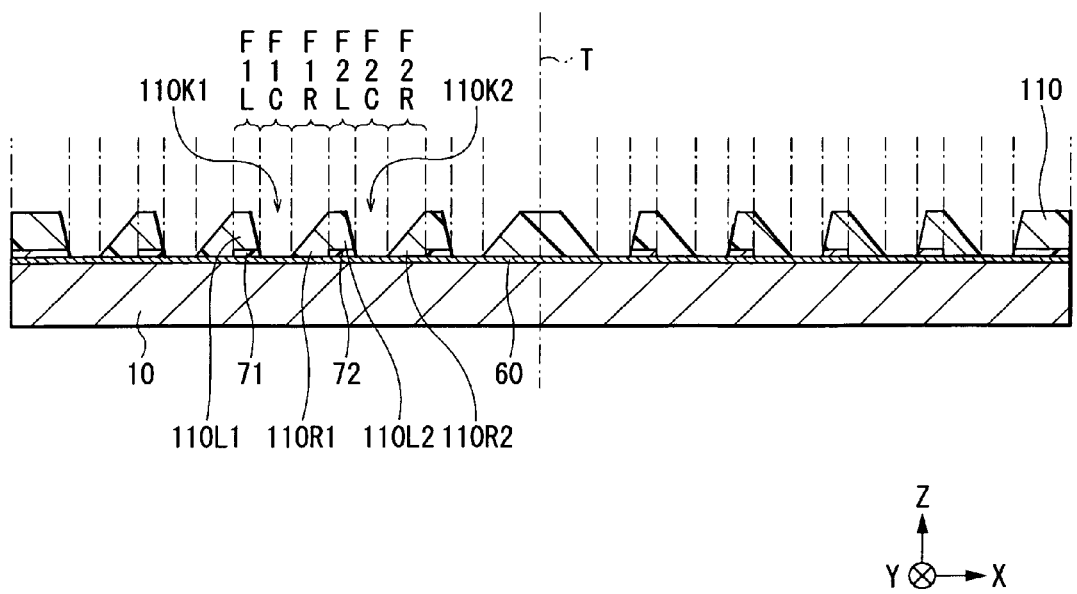
FIG. 7 is a cross section for explaining a process subsequent to FIG. 6.
Figure 8:
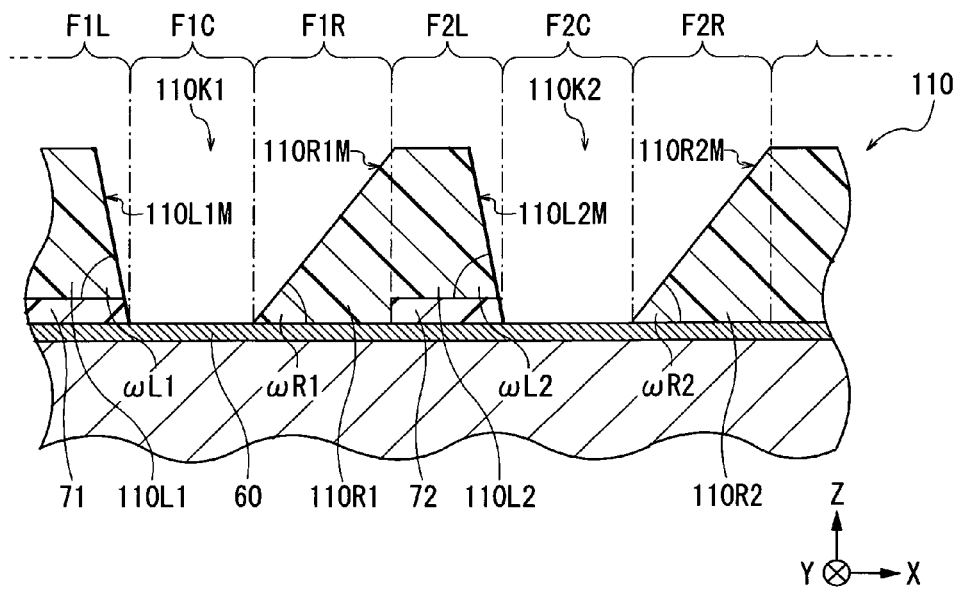
FIG. 8 is a partially enlarged cross section of the sectional configuration shown in FIG. 7.

With reference to FIGS. 1 to 11, as a "method of manufacturing a coil structure" according to the embodiment, a method of manufacturing the common mode choke coil shown in FIGS. 1 to 3 will now be described. FIGS. 4 to 11 are diagrams for explaining a process of manufacturing the common mode choke coil and show sectional configurations corresponding to FIG. 1. Particularly, FIG. 8 is a partially enlarged view of the sectional configuration of FIG. 7. Since the "method of manufacturing a thin film coil" of the invention is used to form the thin film coil 30 (the coil patterns 31 and 32) in the process of manufacturing the common mode choke coil according to the embodiment, the method of manufacturing a thin film coil will be also described below.

In the following, first, an outline of the process of manufacturing the whole common mode choke coil will be described by referring to FIG. 1 and, after that, a process of forming a main part (the thin film coil 30) of the common mode choke coil will be described in detail with reference to FIGS. 1 to 11. Since the materials, dimensions, and structural characteristics of a series of components of the common mode choke coil have been already described in detail, the description will be properly omitted.

The thin film magnetic head is manufactured by, mainly, sequentially forming and stacking components by using an existing thin film process including a film forming technique such as a plating process and sputtering and a patterning technique such as a photolithography process. To be specific, as shown in FIG. 1, first, the seed layer 60 and the thin film coil 30 (the coil patterns 31 and 32) are patterned on the bottom magnetic substrate 10. Subsequently, the insulating layer 40 is formed so as to cover the thin film coil 30, concretely, to cover between the turns of the coil patterns 31 and 32 and the peripheral area. After that, the magnetic layer 50 is formed so as to cover the insulating layer 40 and the peripheral area. Finally, the top magnetic substrate 20 is formed on the magnetic layer 50, thereby completing a common mode choke coil having the configuration that the thin film coil 30 is buried between the bottom magnetic substrate 10 and the top magnetic substrate 20 via the insulating layer 40, magnetic layer 50, and seed layer 60.

Figure 4:
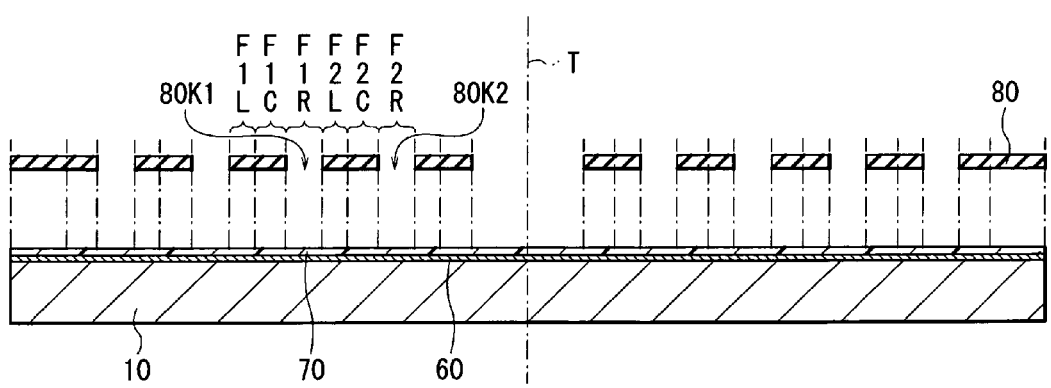
FIG. 4 is a cross section for explaining a process in a manufacturing process of the common mode choke coil according to the first embodiment of the invention.

At the time of forming the thin film coil 30 (the coil patterns 31 and 32), the bottom magnetic substrate 10 is prepared and, after that, as shown in FIG. 4, the seed layer 60 is formed so as to cover the bottom magnetic substrate 10 by using, for example, sputtering. At the time of forming the seed layer 60, for example, a high conductive material similar to that of the coil patterns 31 and 32 (refer to FIG. 9) formed in a post process is used. As a method of forming the seed layer 60, for example, in place of the sputtering, another film forming method such as CVD (Chemical Vapor Deposition) can be used.

Subsequently, as shown in FIG. 4, an exposure control layer for controlling the progress of an exposing process is formed so as to cover the seed layer 60. The exposure control layer is used for controlling an exposure range of exposing a photoresist film 90 (refer to FIG. 6) which is formed in a post process. In this case, for example, by forming a layer made of a material having low light reflectivity so as to cover the seed layer 60, a reflectance suppression layer 70 for suppressing the reflection phenomenon at the time of exposure is formed as the exposure control layer. At the time of forming the reflection suppression layer 70, for example, a material having light reflectivity lower than that of the seed layer 60 is used, concretely, a resist material having a low reflectivity characteristic is used. In the case of using a resist material of this kind, for example, a resist material is applied on the surface of the seed layer 60, thereby forming a resist film. By heating/cooling the resist film as necessary, the reflection suppression layer 70 is formed.

Subsequently, as shown in FIG. 4, a mask 80 having a predetermined pattern shape is prepared. At the time of preparing the mask 80, the position of disposing the mask 80 is determined on the basis of an area in which a photoresist pattern 110 (refer to FIG. 7) is to be formed in a post process. Concretely, with reference to FIG. 7, the mask 80 is disposed in either an inner area F1R (a first inner area) which is positioned on the side close to the center position T and in which an inner frame part 110R1 is to be formed or an outer area F1L (a first outer area) which is positioned on the side far from the center position T and in which an outer frame part 110L1 is to be formed, and either an inner area F2R (a second inner area) which is positioned on the side close to the center position T and in which an inner frame part 110R2 is to be formed or an outer area F2L (a second outer area) which is positioned on the side far from the center position T and in which an outer frame part 110L2 is to be formed on the seed layer 60. On the seed layer 60, the photoresist pattern 110 is to be formed. The photoresist pattern 110 has the inner frame part 110R1 (a first inner frame part) and an outer frame part 110L1 (a first outer frame part) defining an opening 110K1 (a first opening) for forming the coil pattern 31, which are disposed so as to face each other in the X axis direction and, similarly, the inner frame part 110R2 (a second inner frame part) and the outer frame part 110L2 (a second outer frame part) defining an opening 110K2 (a second opening) for forming the coil pattern 32, which are disposed so as to face each other in the X axis direction.

In the inner areas F1R and F2R or the outer areas F1L and F2L, for example, the mask 80 is disposed in the outer areas F1L and F2L. In this case, for example, as shown in FIG. 4, the mask 80 is disposed in a center area F1C in which the opening 110K1 is to be formed and a center area F2C in which the opening 110K2 is to be formed in addition to the outer areas F1L and F2L, that is, openings 80K1 and 80K2 are provided in positions corresponding to the inner areas F1R and F2R, respectively. The mask 80 having the openings 80K1 and 80K2 whose shapes correspond to the pattern shapes of the coil patterns 31 and 32 is prepared.

Figure 5:
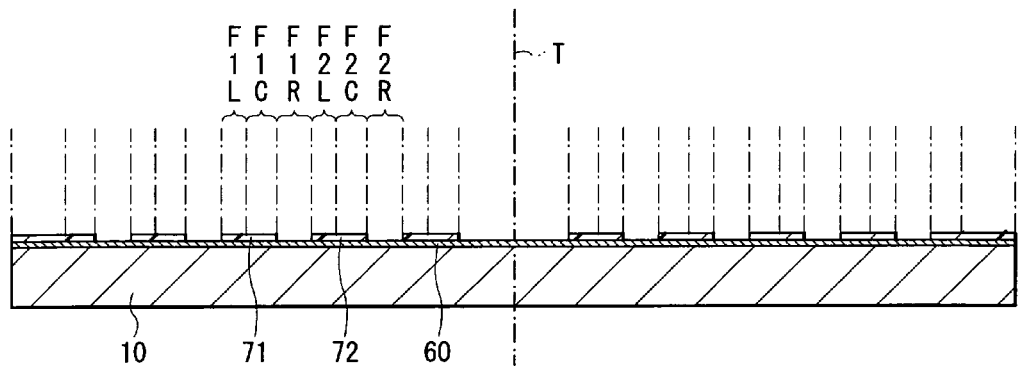
FIG. 5 is a cross section for explaining a process subsequent to FIG. 4.
Figure 5:
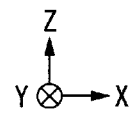

The areas (the inner frame parts F1R and F2R or the outer areas F1L and F2L) in which the mask 80 is to be disposed are selected on the basis of the shapes of the sections of the coil patterns 31 and 32 shown in FIG. 3 (the relation between the inner-side base angles $\theta R1$ and $\theta R2$ and the outer-side base angles $\theta L1$ and $\theta L2$). Specifically, the mask 80 is disposed in an area corresponding to the base angle which is desired to be relatively large, selected from the inner-side base angle $\theta R1$ corresponding to the inner area F1R and the inner-side base angle $\theta R2$ corresponding to the inner area F2R, and the outer-side base angle $\theta L1$ corresponding to an outer area F1L and the outer-side base angle $\theta L2$ corresponding to the outer area F2L. For example, to set the shapes of the sections of the coil patterns 31 and 32 so that the outer-side base angles $\theta L1$ and $\theta L2$ become larger than the inner-side base angles $\theta R1$ and $\theta R2$, the mask 80 is disposed in the outer areas F1L and F2L corresponding to the outer-side base angles $\theta L1$ and $\theta L2$. In FIG. 4 and FIG. 5 and subsequent figures which will be described later, to simplify the drawings, the reference numerals (F1R, F1L, F1C, F2R, F2L, and F2C) are given to only part of a plurality of areas (the inner areas, the center areas, and the outer areas) existing on the seed layer 60.

Subsequently, by using the photolithography process using the mask 80, the reflection suppression layer 70 is patterned so as to be adapted to the pattern shape of the mask 80. Concretely, the reflection suppression layer 70 is selectively exposed via the mask 80. The exposed reflection suppression layer 70 is heated/cooled as necessary and developed with a developing solution, that is, unnecessary parts (parts exposed via the openings 80K1 and 80K2 in the mask 80) in the reflection suppression layer 70 are selectively removed. As a result, as shown in FIG. 5, the reflection suppression layer 70 remains only in the outer areas F1L and F2L and the center areas F1C and F2C on the seed layer 60, in other words, a reflection suppression layer 71 (first exposure control layer) is patterned in the outer area F1L and the center area F1C, and a reflection suppression layer 72 (second exposure control layer) is patterned in the outer area F2L and the center area F2C. For reference purposes, with respect to the areas of disposing the reflection suppression layers 71 and 72, it is not always necessary to dispose the reflection suppression layer 71 in the outer area F1L and the center area F1C and to dispose the reflection suppression layer 72 in the outer area F2L and the center area F2C. For example, the reflection suppression layer 71 may be disposed only in the outer area F1L and not in the center area F1C, and the reflection suppression layer 72 may be disposed only in the outer area F2L and not in the center area F2C. FIG. 5 shows a state where the used mask 80 is removed.

Subsequently, after the photoresist is applied on the surface of the seed layer 60 and the reflection suppression layers 71 and 72, the photoresist is heated/cooled as necessary, thereby forming the photoresist film 90 so as to cover the seed layer 60 and the reflection suppression layers 71 and 72 as shown in FIG. 6. At the time of forming the photoresist film 90, for example, it is preferable to adjust the thickness of the photoresist 90 so as to be larger than the thickness of the coil patterns 31 and 32 (refer to FIG. 9) to be formed in a post process.

Subsequently, as shown in FIG. 6, a mask 100 having a predetermined shape is prepared. At the time of preparing the mask 100, openings 100K1 and 100K2 corresponding to the center areas F1C and F2C, respectively, are formed so as to have shapes corresponding to the pattern shapes of the coil patterns 31 and 32, respectively.

By using a photolithography process with the mask 100, the photoresist film 90 is patterned so as to be adapted to the pattern shape of the mask 100. Concretely, the photoresist film 90 is selectively exposed via the mask 100. The exposed photoresist film 90 is heated/cooled as necessary and developed with a developing solution, that is, unnecessary parts (parts exposed via the openings 100K1 and 100K2 in the mask 100) in the photoresist film 90 are selectively removed. In particular, at the time of patterning the photoresist film 90 by using the photolithography process, for example, by patterning the reflection suppression layers 71 and 72 together with the photoresist 90, unnecessary parts (exposed parts) of the reflection suppression layers 71 and 72 are removed together with the unnecessary parts (exposed parts) of the photoresist film 90. As shown in FIG. 7, the openings 110K1 and 110K2 are formed in positions corresponding to the openings 100K1 and 100K2, respectively, in the photoresist film 90. Consequently, the photoresist pattern 110 having the inner frame part 110R1 disposed in the inner area F1R, the outer frame part 110L1 disposed in the outer area F1L, the inner frame part 110R2 disposed in the inner area F2R, and the outer frame part 110L2 disposed in the outer area F2L is formed over the seed layer 60. The opening 110K1 is defined by the inner frame part 110R1 and the outer frame part 110L1, and the opening 110K2 is defined by the inner frame part 110R2 and the outer frame part 110L2. FIG. 7 shows a state where the used mask 100 is removed.

At the time of forming the photoresist pattern 110 by exposing and patterning the photoresist film 90 by using the photolithography process, light for exposure is used to expose the photoresist film 90 and, after that, is irregularly reflected by the seed layer 60. Due to the influence of the irregular reflection of the light, variations occur in the Z axis direction in the exposure range in the photoresist film 90. As a result, the exposure range in the photoresist film 90 is gradually widened from the side close to the seed layer 60 toward the far side. Consequently, in the photoresist pattern 110 formed finally, the width (opening width) of the openings 110K1 and 110K2 decreases gradually toward the seed layer 60.

In this case, particularly, the reflection suppression layers 71 and 72 are not disposed in the inner areas F1R and F2R on the seed layer 60 but are disposed in the outer areas F1L and F2L, respectively. Therefore, the exposure range in the photoresist film 90 relatively varies according to the presence or absence of the reflection suppression layers 71 and 72 between the inner areas F1R and F2R and the outer areas F1L and F2L. Concretely, light tends to be relatively reflected irregularly in the inner areas F1R and F2R and is not relatively reflected irregularly in the outer areas F1L and F2L, so that the exposure range in the photoresist film 90 in the outer areas F1L and F2L is narrower than that in the inner areas F1R and F2R. By utilizing the relative difference of the exposure ranges, as shown in FIG. 8, an inclination angle ωR1 of an inner-side defining face 110R1M (a first inner-side defining face) defining the opening 110K1 in the inner frame part 110R1 and an inclination angle ωL1 of an outer-side defining face 110L1M (a first outer-side defining face) defining the opening 110K1 in the outer frame part 110L1 are made different from each other (ωR1≠ωL1). An inclination angle ωR2 of an inner-side defining face 110R2M (a second inner-side defining face) defining the opening 110K2 in the inner frame part 110R2 and an inclination angle ωL2 of an outer-side defining face 110L2M (a second outer-side defining face) defining the opening 110K2 in the outer frame part 110L2 are made different from each other (ωR2≠ωL2). Concretely, the inclination angle ωL1 is larger than the inclination angle ωR1 (ωR1<ωL1), and the inclination angle ωL2 is larger than the inclination angle ωR2 (ωR2<ωL2).

For confirmation, the inclination angle ωR1 is an angle formed between the inner-side defining face 110R1M and an extended face (XY face) of the seed layer 60, and the inclination angle ωL1 is an angle formed between the outer-side defining face 110L1M and an extended face of the seed layer 60. Similarly, the inclination angle ωR2 is an angle formed between the inner-side defining face 110R2M and an extended face of the seed layer 60, and the inclination angle ωL2 is an angle formed between the outer-side defining face 110L2M and an extended face of the seed layer 60. The inclination angles ωR1, ωL1, ωR2, and ωL2 are angles defining the inner-side base angle θR1, the outer-side base angle θL1, the inner-side base angle θR2, and the outer-side base angle θL2, respectively, (refer to FIG. 3) in the sections of the coil patterns 31 and 32 formed in post processes. In the case where the coil patterns 31 and 32 are formed finally, the inner-side base angle θR1 is defined on the basis of the inclined angle ωR1 and the outer-side base angle θL1 is defined on the basis of the inclined angle ωL1. The inner-side base angle θR2 is defined on the basis of the inclined angle ωR2 and the outer-side base angle θL2 is defined on the basis of the inclined angle ωL2. Concretely, for example, as described above, in the case of forming the photoresist pattern 110 so that the inclination angle ωL1 is larger than the inclination angle ωR1 and the inclination angle ωL2 is larger than the inclination angle ωR2 (ωR1<ωL1, ωR2<ωL2), in the cross section of the coil patterns 31 and 32 finally formed, the outer-side base angle θL1 is larger than the inner-side base angle θR1, and the outer-side base angle θL2 is larger than the inner-side base angle θR2 (θR1<θL1, θR2<θL2).

In the case of heating the photoresist film 90 in the process of forming the photoresist pattern 110, in reality, the inner-side defining faces 110R1M and 110R2M and the outer-side defining faces 110L1M and 110L2M may be curved. However, in FIGS. 7 and 8 and FIG. 9 and subsequent drawings which will be described later, to simplify the drawings, the inner-side defining faces 110R1M and 110R2M and the outer-side defining faces 110L1M and 110L2M are shown as flat faces.

Figure 9:
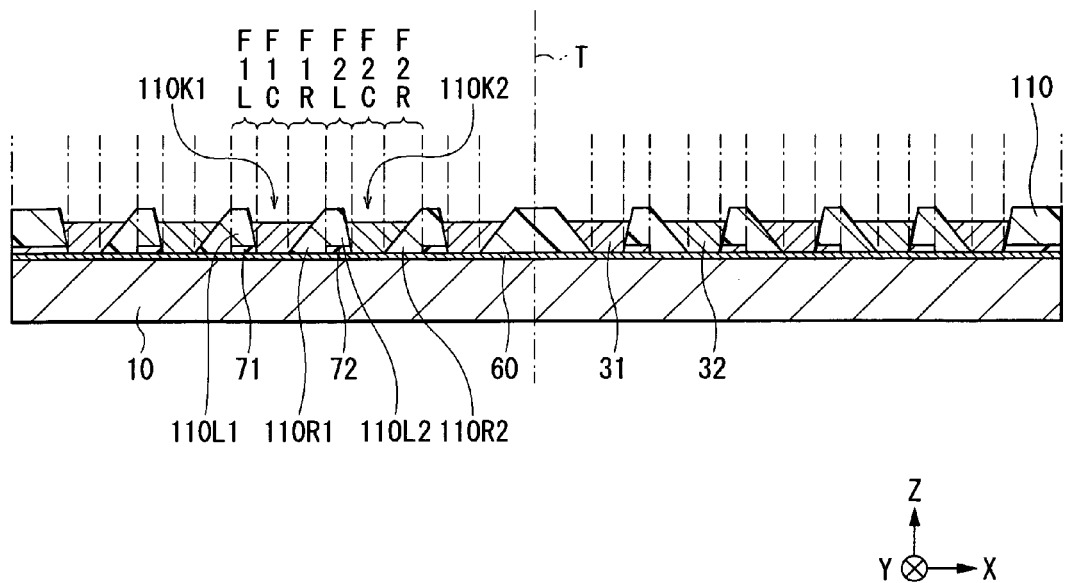
FIG. 9 is a cross section for explaining a process subsequent to FIG. 7.

Subsequently, as shown in FIG. 9, the coil pattern 31 is formed in the opening 110K1 in the photoresist pattern 110 and, similarly, the coil pattern 32 is formed in the opening 110K2. At the time of forming the coil patterns 31 and 32, for example, by growing a plating film by using the seed layer 60, the coil patterns 31 and 32 are formed. In particular, at the time of forming the coil patterns 31 and 32, it is preferable to use a high conductive material such as copper (Cu) and to adjust the thickness of the coil patterns 31 and 32 so as to be smaller than the thickness of the photoresist pattern 110. As shown in FIGS. 1 and 3, the coil pattern 31 is formed so as to have an inverted trapezoid shape in cross section which is bilaterally asymmetrical, including the edge 31E1 positioned on the side far from the seed layer 60 and specifying the inner-side base angle θR1 corresponding to the inner area F1R and the outer-side base angle θL1 corresponding to the outer area F1L as a longer one of a set of opposite sides which are parallel to each other, and the other edge 31E2 positioned on the side close to the seed layer 60 as a shorter one of the set of opposite sides. The inner-side base angle θR1 and the outer-side base angle θL1 are different from each other. Similarly, the coil pattern 32 has an inverted trapezoid shape in cross section which is bilaterally asymmetrical including the edge 32E1 positioned on the side far from the seed layer 60 and specifying the inner-side base angle θR2 corresponding to the inner area F2R and the outer-side base angle θL2 corresponding to the outer area F2L as a longer one of the set of opposite sides which are parallel to each other, and the other edge 32E2 positioned on the side close to the seed layer 60 as a shorter one of the set of opposite sides. The inner-side base angle θR2 and the outer-side base angle θL2 are different from each other. For example, in the section of the coil pattern 31, the outer-side base angle θL1 is larger than the inner-side base angle θR1 (θR1<θL1), and the outer-side base angle θL2 is larger than the inner-side base angle θR2 in the section of the coil pattern 32 (θR2<θL2).

Figure 10:
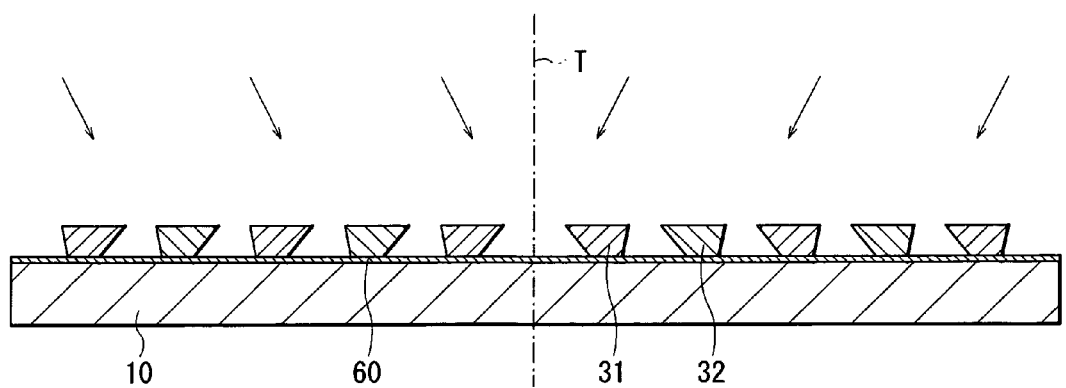
FIG. 10 is a cross section for explaining a process subsequent to FIG. 9.

Subsequently, by dissolving the reflection suppression layers 71 and 72 and the photoresist pattern 110 by using an organic solvent such as acetone, as shown in FIG. 10, the reflectance suppression layers 71 and 72 and the photoresist pattern 110 are removed. By the operation, the seed layer 60 is exposed in the positions where the reflectance suppression layers 71 and 72 and the photoresist pattern 110 were provided.

Finally, both of the coil patterns 31 and 32 are used as a mask and the seed layer 60 is selectively etched by using, for example, ion milling, thereby removing the seed layer 60 in the parts which are not covered with the coil patterns 31 and 32 to expose the bottom magnetic substrate 10. At the time of etching the seed layer 60 by using ion milling, for example, an etching process is performed in an argon ion (Ar$^+$) atmosphere. At the time of etching the seed layer 60, for example, in place of the ion milling, other dry etching such as RIE (Reactive Ion Etching) or wet etching instead of the dry etching can be also employed. In such a manner, the thin film coil 30 including the coil patterns 31 and 32 which are parallel to each other and are turned spirally around the center position T is completed on the bottom magnetic substrate 10.

In the method of manufacturing the common mode choke coil according to the embodiment, by patterning the photoresist film 90 by exposure in a state where the reflection suppression layers 71 and 72 are formed in the outer areas F1L and F2L, respectively, the photoresist pattern 110 is formed in such a manner that the width of each of the openings 110K1 and 110K2 gradually decreases toward the seed layer 60. After that, the coil patterns 31 and 32 are formed in the openings 110K1 and 110K2 in the photoresist pattern 110, thereby forming the thin film coil 30. In this case, as described above, because of the optical action that the exposure range in the photoresist film 90 in the outer areas F1L and F2L is narrower than that in the inner areas F1R and F2R in accordance with the presence or absence of the reflection suppression layers 71 and 72, the inclination angles ωL1 and ωL2 of the outer frame parts 110L1 and 110L2 become larger than the inclination angles ωR1 and ωR2 of the inner frame parts 110R1 and 110R2 in the photoresist pattern 110. Consequently, when the coil patterns 31 and 32 are formed in the openings 110K1 and 110K2, respectively, in the photoresist pattern 110, the relation of the inclination angles ωR1, ωL1, ωR2, and ωL2 is reflected and the outer-side base angles θL1 and θL2 become larger than the inner-side base angles θR1 and θR2. That is, both of the coil patterns 31 and 32 are formed so as to have an inverted trapezoid shape in cross section which is bilaterally asymmetrical. Moreover, in this case, for forming the coil patterns 31 and 32 so as to have the section of the inverted trapezoid shape which is bilaterally asymmetrical, only the existing thin film process such as the film forming technique, patterning technique, and etching technique is used and novel and complicated manufacturing processes are not used. Thus, the thin film coil 30 is easily formed by using only the existing thin film process. Therefore, in the embodiment, the thin film coil 30 can be easily formed so that the section of each of the coil patterns 31 and 32 becomes the inverted trapezoid shape which is bilaterally asymmetrical. Thus, a common mode choke coil having the thin film coil 30 can be manufactured as easy as possible.

In addition to the above, in the method of manufacturing the thin film coil according to the embodiment, to form the thin film coil 30 in which the section of each of the coil patterns 31 and 32 has the inverted trapezoid shape which is bilaterally asymmetrical, as described above, only the existing thin film process is used and novel and complicated manufacturing processes are not used. Therefore, in the embodiment, the thin film coil 30 can be manufactured as easily as possible by using only the existing thin film process.

In the embodiment, at the time of forming the photoresist pattern 110, when the amount of exposure for the photoresist film 90 is adjusted by changing the intensity of light for exposure and the reflection suppression amount is adjusted by changing the thickness of the reflection suppression layers 71 and 72, the inclination angles ωR1, ωL1, ωR2, and ωL2 change on the basis of the exposure amounts and the reflection suppression amount. Consequently, the inner-side base angles θR1 and θR2 and the outer-side base angles θL1 and θL2 in the sections of the coil patterns 31 and 32 are finally set on the basis of the inclination angles ωR1, ωL1, ωR2, and ωL2. Therefore, since the inner-side base angles θR1 and θR2 and the outer-side base angles θL1 and θL2 can be controlled by adjusting the exposure amount and the reflection suppression amount at the time of forming the photoresist pattern 110, the section of each of the coil patterns 31 and 32 can be freely controlled.

Figure 12:
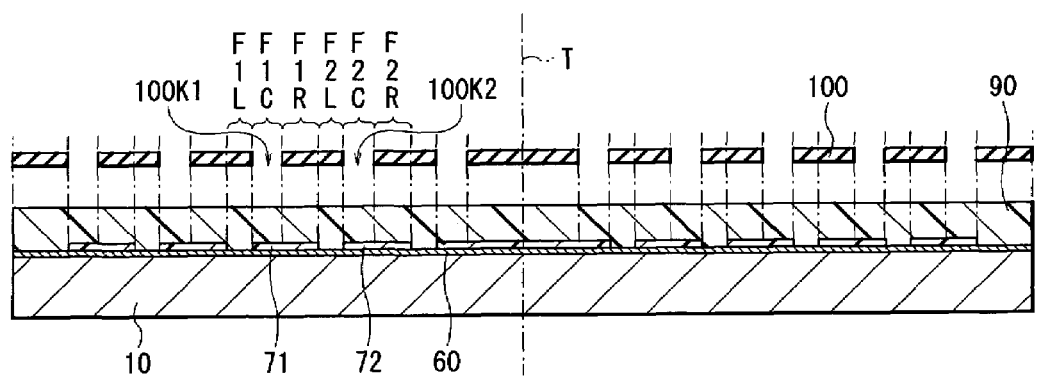
FIG. 12 is a cross section for explaining a modification of the method of manufacturing the common mode choke coil according to the first embodiment of the invention.
Figure 13:
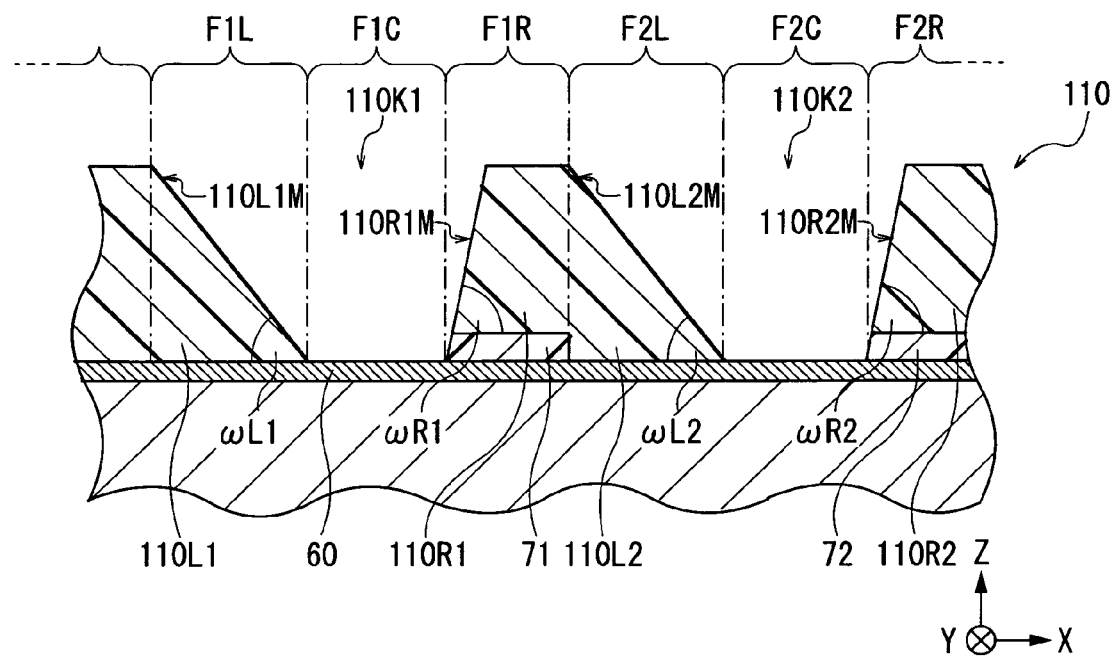
FIG. 13 is a cross section for explaining a process subsequent to FIG. 12.
Figure 14:
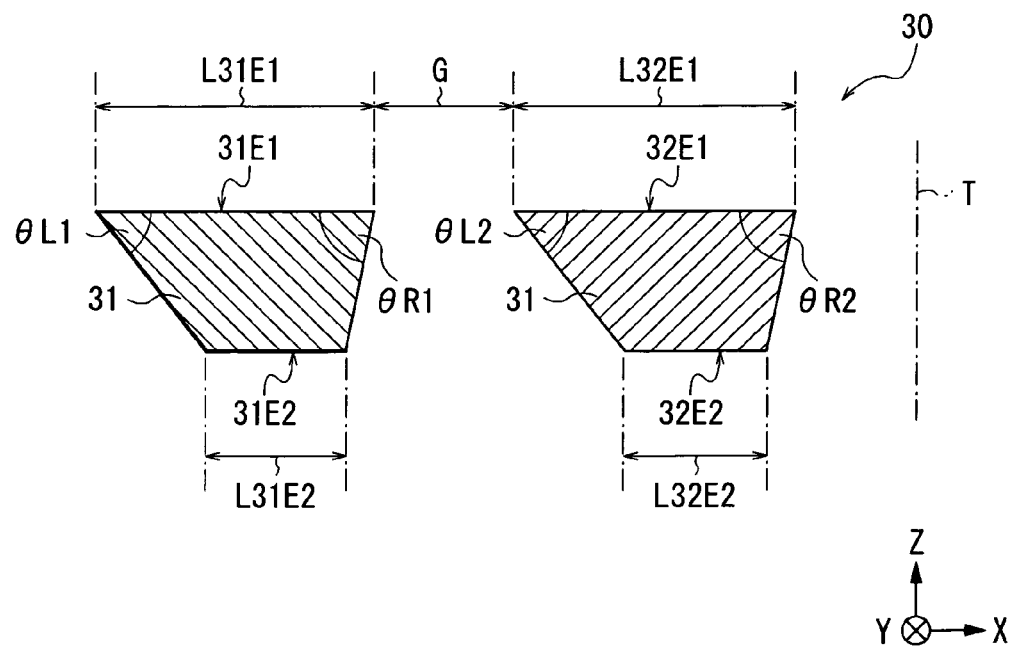
FIG. 14 is a cross section showing a sectional configuration of a thin film coil formed by using a photoresist pattern illustrated in FIG. 13.

In the embodiment, as shown in FIGS. 6 and 8, the photoresist film 90 is exposed and patterned. Consequently, at the time of forming the photoresist pattern 110, the reflection suppression layer 71 is disposed in the outer area F1L and the center area F1C, and the reflection suppression layer 72 is disposed in the outer area F2L and the center area F2C, thereby making the outer-side base angle θL1 larger than the inner-side base angle θR1 in the section of the coil pattern 31 and making the outer-side base angle θL2 larger than the inner-side base angle θR2 in the section of the coil pattern 32 (θR1<θL1, θR2<θL2) as shown in FIG. 3. However, the invention is not always limited to the arrangement. Concretely, for example, as shown in FIG. 12, by disposing the reflection suppression layer 71 in the inner area F1R and the center area F1C in place of the outer area F1L and the center area F1C and disposing the reflection suppression layer 72 in the inner area F2R and the center area F2C in place of the outer area F2L and the center area F2C, as shown in FIG. 13, in a manner similar to the case shown in FIGS. 6 and 8, the photoresist pattern 110 may be formed so that the inclination angles ωR1 and ωR2 become larger than the inclination angles ωL1 and ωL2 by using a relative difference in the exposure range on the basis of the presence/absence of the reflection suppression layers 71 and 72 (ωR1>ωL1, ωR2>ωL2). In this case, by forming the coil patterns 31 and 32 with the photoresist pattern 110 shown in FIG. 13, as shown in FIG. 14, the inner-side base angle θR1 becomes larger than the outer-side base angle θL1 in the section of the coil pattern 31 and the inner-side base angle θR2 becomes larger than the outer-side base angle θL2 in the section of the coil pattern 32 (θR1>θL1, θR2>θL2). In this case as well, effects similar to those of the embodiment can be obtained. In particular, the values of the inner-side base angles θR1 and θR2 and the outer-side base angles θL1 and θL2 and the relations of the values can be freely set in accordance with, for example, the design specification of the common mode choke coil, the target performance, and the like.

Second Embodiment

A second embodiment of the invention will now be described.

Figure 15:
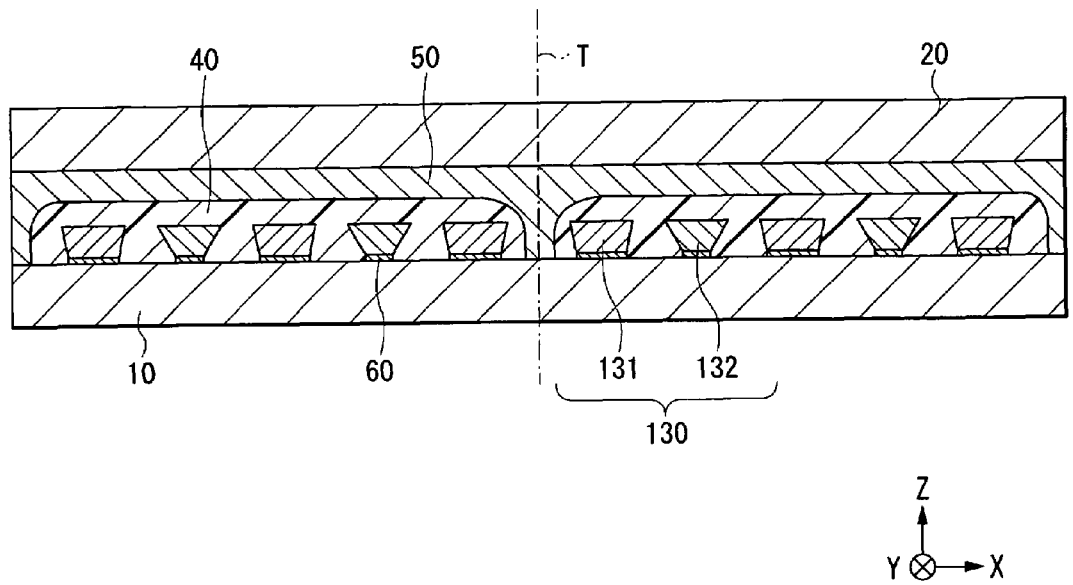
FIG. 15 is a cross section schematically showing a sectional configuration of a common mode choke coil according to a second embodiment of the invention.
Figure 16:
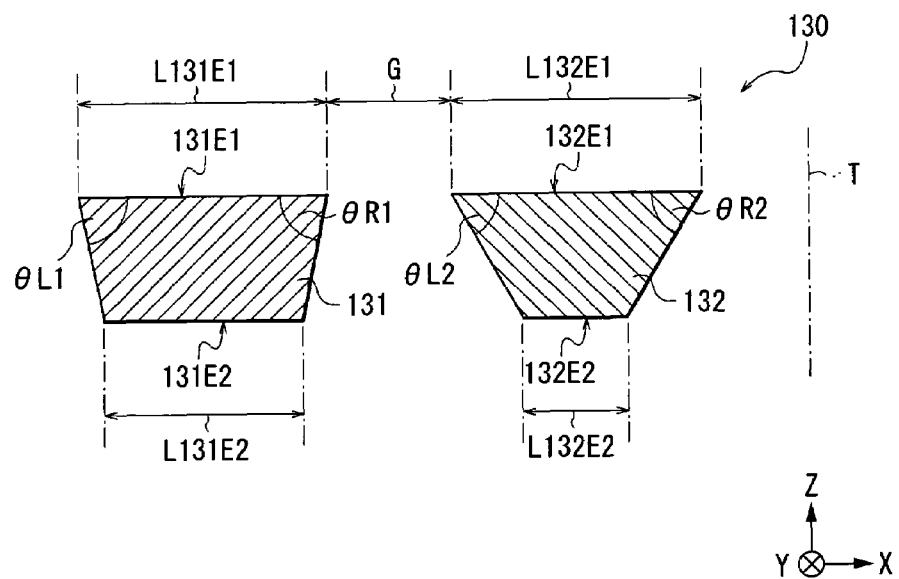
FIG. 16 is a partially enlarged cross section showing a sectional configuration of a thin film coil.

FIGS. 15 and 16 schematically show the configuration of a common mode choke coil as the "coil structure" according to the second embodiment of the invention. FIG. 15 schematically shows a sectional configuration of the common mode choke coil. FIG. 16 is a partially enlarged view of a sectional configuration of the common mode choke coil. In the FIGS. 15 and 16, the same reference numerals are designated to the same components as those of the first embodiment. Since the "thin film coil" of the invention is a component of the common mode choke coil, the thin film coil will be also described below.

As shown in FIG. 15, the common mode choke coil according to the second embodiment has a configuration which is similar to that of the common mode choke coil described in the first embodiment (refer to FIG. 1) except for the point that it has a thin film coil 130 including coil patterns 131 and 132 corresponding to the coil patterns 31 and 32 in place of the thin film coil 30 including the coil patterns 31 and 32. Specifically, the common mode choke coil has a configuration that the thin film coil 130 is buried between the bottom magnetic substrate 10 and the top magnetic substrate 20 via the insulating layer 40, magnetic layer 50, and seed layer 60.

The coil patterns 131 and 132 constructing the thin film coil 130 have configurations similar to those of the coil patterns 31 and 32 (refer to FIGS. 2 and 3), respectively, described in the foregoing first embodiment except for the point that the coil patterns 131 and 132 have different shapes of the sections and have inverted trapezoid shapes each of which is bilaterally symmetrical instead of having the same shape of the section which is the bilaterally-asymmetrical inverted trapezoid shape.

More specifically, the section of each of the coil patterns 131 and 132 has an inverted trapezoid shape as shown in FIGS. 15 and 16. Specifically, the section of the coil pattern 131 has a trapezoid shape (inverted trapezoid shape) including a side 131E1 positioned on the side far from the seed layer 60 and specifying two base angles (an inner-side base angle θR1 and an outer-side base angle θL1) as a longer one of a set of opposite sides which are parallel to each other, and the other side 131E2 positioned on the side close to the seed layer 60 as a shorter one of the set of opposite sides. Similarly, the section of the coil pattern 132 has a trapezoid shape (inverted trapezoid shape) including a side 132E1 positioned on the side far from the seed layer 60 and specifying two base angles (an inner-side base angle θR2 and an outer-side base angle θL2) as a longer one of a set of opposite sides which are parallel to each other, and the other side 132E2 positioned on the side close to the seed layer 60 as a shorter one of the set of opposite sides.

Particularly, in an arbitrary winding position, the section of the coil pattern 131 and that of the coil pattern 132 are different from each other as shown in FIG. 16. More concretely, the section of each of the coil patterns 131 and 132 has an inverted-trapezoid shape which is symmetrical bilaterally. To be specific, in the section of the coil pattern 131, for example, out of the two base angles (the inner-side base angle θR1 and the outer-side base angle θL1), the inner-side base angle θR1 (first inner-side base angle) positioned on the side close to the center position T and the outer-side base angle θL1 (first outer-side base angle) positioned on the side far from the center position T match each other (θR1=θL1). Similarly, in the section of the coil pattern 132, for example, out of the two base angles (the inner-side base angle θR2 and the outer-side base angle θL2), the inner-side base angle θR2 (second inner-side base angle) positioned on the side close to the center position T and the outer-side base angle θL2 (second outer-side base angle) positioned on the side far from the center position T match each other (θR2=θL2). The inner-side base angle θR1 and the outer-side base angle θL1 and the inner-side base angle θR2 and the outer-side base angle θL2 are different from each other (θR1, θL1≠θR2, θL2). In this case, the inner-side base angle θR1 and the outer-side base angle θL1 are larger than the inner-side base angle θR2 and the outer-side base angle θL2 (θR1, θL1>θR2, θL2).

As an example of concrete dimensions in the case of FIG. 16, the length L131E1 of the side 131E1=about 20 μm, the length L131E2 of the side 131E2=about 18 μm, the length L132E1 of the side 132E1=about 20 μm, the length L132E2 of the side 132E2=about 8 μm, each of the inner-side base angles θR1 and the outer-side base angle θR2=about 85°, each of the inner-side base angles θR2 and the outer-side base angle θL2=about 60°, and the interval G between the turns=about 5 μm.

In the common mode choke coil according to the embodiment, the section of each of the two coil patterns 131 and 132 constructing the thin film coil 130 has the inverted-trapezoid shape which is bilaterally symmetrical. Consequently, by the action similar to that of the first embodiment, while reducing the facing areas contributing to capacitance as much as possible, electric resistance (direct current resistance) is minimized. Therefore, by reducing the capacitance as much as possible, the differential transmission characteristic can be improved.

In addition, in the thin film coil 130 according to the embodiment, since the section of each of the coil patterns 131 and 132 has the inverted trapezoid shape which is bilaterally symmetrical, as described above, the capacitance is reduced as much as possible because of the shapes of the section of the coil patterns 131 and 132. Therefore, by constructing the common mode choke coil by using the thin film coil 130, it can contribute to improvement in the differential transmission characteristic.

The configurations, operations, actions, and effects other than the above of the common mode choke coil according to the second embodiment are similar to those of the first embodiment.

Figure 19:
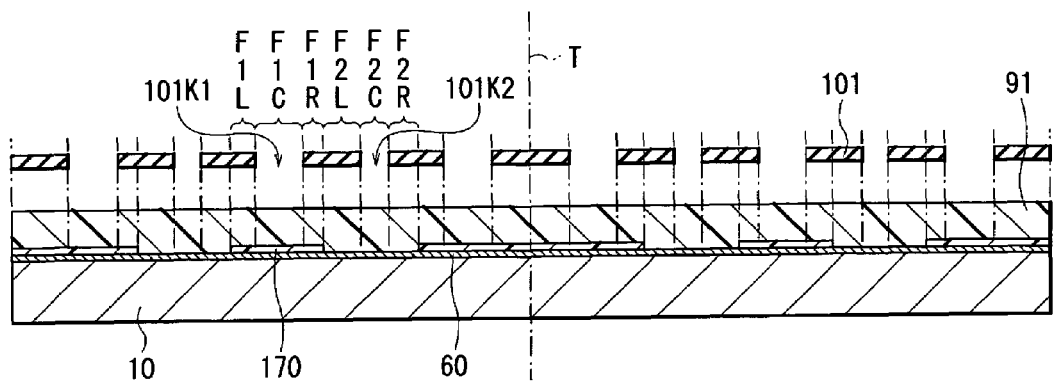
FIG. 19 is a cross section for explaining a process subsequent to FIG. 18.
Figure 20:
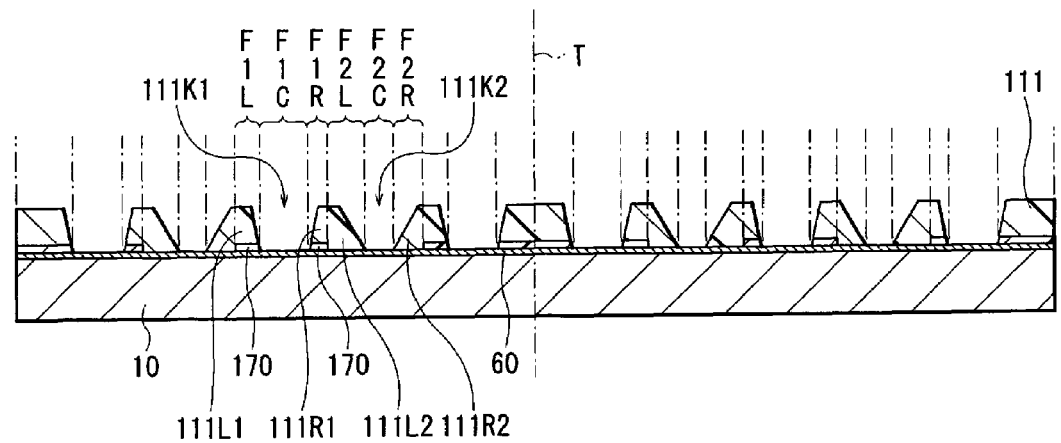
FIG. 20 is a cross section for explaining a process subsequent to FIG. 19.
Figure 21:
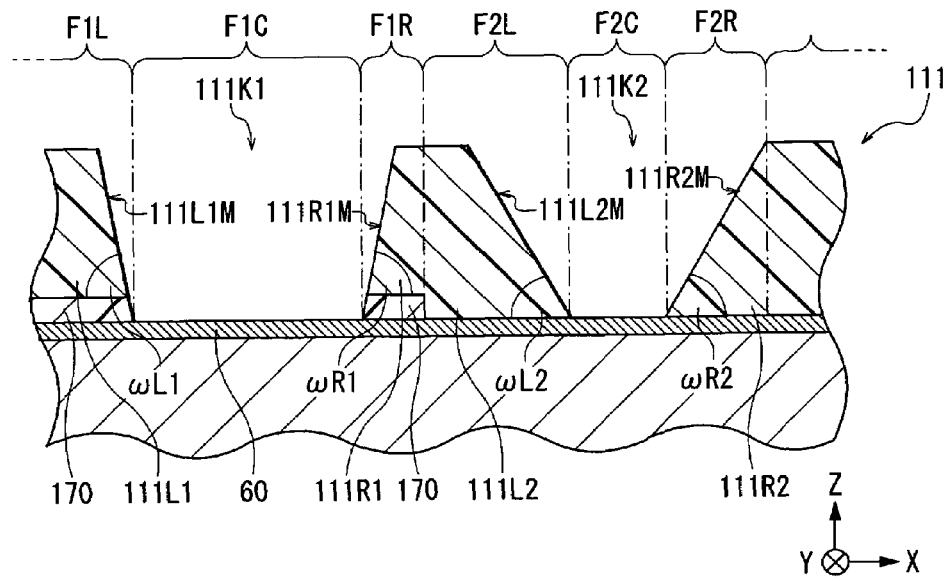
FIG. 21 is a partially enlarged cross section of the sectional configuration shown in FIG. 20.

With reference to FIGS. 17 to 24, as a "method of manufacturing a coil structure" according to the second embodiment, a method of manufacturing the common mode choke coil shown in FIGS. 15 and 16 will now be described. FIGS. 17 to 24 are diagrams for explaining a process of manufacturing the common mode choke coil and show sectional configurations corresponding to FIG. 15. Particularly, FIG. 21 is a partially enlarged view of the sectional configuration of FIG. 20. In the following, in the method of manufacturing a common mode choke coil, a method of manufacturing the thin film coil 130 (the coil patterns 131 and 132) will be mentioned. Since the "method of manufacturing a thin film coil" of the invention is used to form the thin film coil 130 (the coil patterns 131 and 132) in the process of manufacturing the common mode choke coil according to the second embodiment, the method of manufacturing a thin film coil will be also described below.

Figure 17:
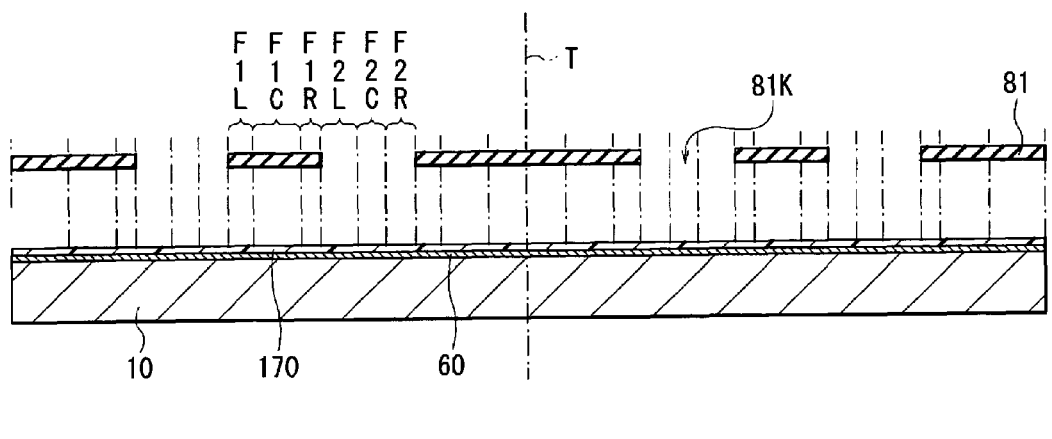
FIG. 17 is a cross section for explaining a process in a manufacturing process of the common mode choke coil according to the second embodiment of the invention.

At the time of forming the thin film coil 130 (the coin patterns 131 and 132), as shown in FIG. 17, by performing a procedure similar to the procedure described with reference to FIG. 4 in the foregoing first embodiment, the seed layer 60 and an exposure control layer (a reflection suppression layer 170) are sequentially formed and stacked on the bottom magnetic substrate 10. After that, a mask 81 having a predetermined pattern shape is prepared. At the time of preparing the mask 81, the position of disposing the mask 81 is determined on the basis of the area in which a photoresist pattern 111 (refer to FIG. 20) is formed in a post process. Concretely, for example, with reference to FIG. 20, the mask 81 is disposed in both of an inner area F1R (a first inner area) which is positioned on the side close to the center position T and in which an inner frame part 111R1 is to be formed or an outer area F1L (a first outer area) which is positioned on the side far from the center position T and in which an outer frame part 111L1 is to be formed, or either an inner area F2R (a second inner area) which is positioned on the side close to the center position T and in which an inner frame part 111R2 is to be formed or an outer area F2L (a second outer area) which is positioned on the side far from the center position T and in which an outer frame part 111L2 is to be formed on the seed layer 60. On the seed layer 60, the photoresist pattern 111 is to be formed. The photoresist pattern 111 has the inner frame part 111R1 (a first inner frame part) and an outer frame part 111L1 (a first outer frame part) defining an opening 111K1 (a first opening) for forming the coil pattern 131, which are disposed so as to face each other in the X axis direction and, similarly, the inner frame part 111R2 (a second inner frame part) and the outer frame part 111L2 (a second outer frame part) defining an opening 111K2 (a second opening) for forming the coil pattern 132, which are disposed so as to face each other in the X axis direction.

For example, the mask 81 is disposed in the inner area F1R and the outer area F1L or in the inner area F2R and the outer area F2L (in this case, in the inner area F1R and the outer area F1L). In this case, for example, as shown in FIG. 17, the mask 81 is disposed in the center area F1C in which the opening 111K1 is to be formed in addition to the inner area F1R and the outer area F1L, that is, an opening 81K is provided in a position corresponding to a combined area of the inner area F2R, outer area F2L, and a center area F2C in which an opening 111K2 is to be formed. The mask 81 having the opening 81K whose shape corresponds to the pattern shape of the coil pattern 132 is prepared.

Figure 18:
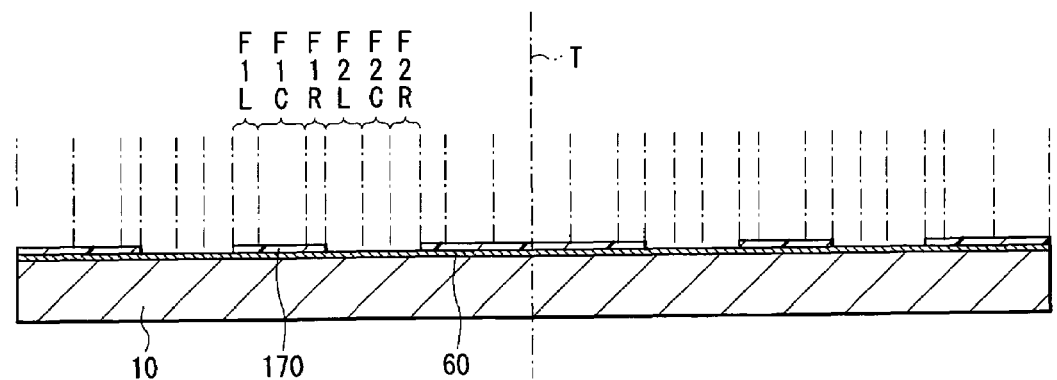
FIG. 18 is a cross section for explaining a process subsequent to FIG. 17.

The areas (the inner area F1R and the outer area F1L or the inner area F2R and the outer area F2L) in which the mask 81 is to be disposed are selected on the basis of the shapes of the section of the coil patterns 131 and 132 shown in FIG. 16 (the relation between the inner-side base angle θR1 and the outer-side base angle θL1 and the inner-side base angle θR2 and the outer-side base angle θL2). That is, the mask 81 is disposed in an area corresponding to the base angle which is desired to be relatively large, selected from the inner-side base angle θR1 corresponding to the inner area F1R and the outer-side base angle θL1 corresponding to the outer area F1L, or the inner-side base angle θR2 corresponding to the inner area F2R and the outer-side base angle θL2 corresponding to the outer area F2L. For example, to set the shapes of the sections of the coil patterns 131 and 132 so that the inner-side base angle θR1 becomes larger than the inner-side base angle θR2 and the outer-side base angle θL1 becomes larger than the outer-side base angle θL2, the mask 81 is disposed in the inner and outer areas F1R and F1L corresponding to the inner-side base angle θR1 and the outer-side base angle θL1. In FIG. 17 and FIG. 18 and subsequent figures which will be described later, to simplify the drawings, the reference numerals (F1R, F1L, F1C, F2R, F2L, and F2C) are given to only part of a plurality of areas (the inner areas, the center areas, and the outer areas) existing on the seed layer 60.

Subsequently, by using the photolithography process using the mask 81, the reflection suppression layer 170 is patterned so as to be adapted to the pattern shape of the mask 81. Concretely, the reflection suppression layer 170 is selectively exposed via the mask 81. The exposed reflection suppression layer 170 is heated/cooled as necessary and developed with a developing solution, that is, an unnecessary part (part exposed via the opening 81K in the mask 81) in the reflection suppression layer 170 is selectively removed. As a result, as shown in FIG. 18, the reflection suppression layer 170 remains only in the inter area F1R, the outer area F1L and the center area F1C on the seed layer 60. For reference purposes, with respect to the area of disposing the reflection suppression layer 170, it is not always necessary to dispose the reflection suppression layer 170 in the inner area F1R, the outer area F1L, and the center area F1C. For example, the reflection suppression layer 170 may be disposed only in the inner area F1R and the outer area F1L but not in the center area F1C. FIG. 18 shows a state where the used mask 81 is removed.

Subsequently, after the photoresist is applied on the surface of the seed layer 60 and the reflection suppression layer 170, the photoresist is heated/cooled as necessary, thereby forming a photoresist film 91 so as to cover the seed layer 60 and the reflection suppression layer 170 as shown in FIG. 19. At the time of forming the photoresist film 91, for example, it is preferable to adjust the thickness of the photoresist film 91 so as to be larger than the thickness of the coil patterns 131 and 132 (refer to FIG. 22) to be formed in a post process.

Subsequently, as shown in FIG. 19, a mask 101 having a predetermined shape is prepared. At the time of preparing the mask 101, openings 101K1 and 101K2 corresponding to the center areas F1C and F2C, respectively, are formed so as to have shapes corresponding to the pattern shapes of the coil patterns 131 and 132, respectively.

By using a photolithography process with the mask 101, the photoresist film 91 is patterned so as to be adapted to the pattern shape of the mask 101. Concretely, the photoresist film 91 is selectively exposed via the mask 101. The exposed photoresist film 91 is heated/cooled as necessary and developed with a developing solution, that is, unnecessary parts (parts exposed via the openings 101K1 and 101K2 in the mask 101) in the photoresist film 91 are selectively removed. In particular, at the time of patterning the photoresist film 91 by using the photolithography process, for example, by patterning the reflection suppression layer 170 together with the photoresist 91, the unnecessary parts (exposed parts) in the reflection suppression layer 170 are removed together with the unnecessary parts (exposed parts) of the photoresist film 91. As shown in FIG. 20, the openings 111K1 and 111K2 are formed in positions corresponding to the openings 101K1 and 101K2, respectively, in the photoresist film 91. Consequently, the photoresist pattern 111 having the inner frame part 111R1 disposed in the inner area F1R, the outer frame part 111L1 disposed in the outer area F1L, the inner frame part 111R2 disposed in the inner area F2R, and the outer frame part 111L2 disposed in the outer area F2L is formed over the seed layer 60. The opening 111K1 is defined by the inner frame part 111R1 and the outer frame part 111L1, and the opening 111K2 is defined by the inner frame part 111R2 and the outer frame part 111L2. FIG. 20 shows a state where the used mask 101 is removed.

At the time of forming the photoresist pattern 111 by exposing and patterning the photoresist film 91 by using the photolithography process, light for exposure is used to expose the photoresist film 91 and, after that, is irregularly reflected by the seed layer 60. Due to the influence of the irregular reflection of the light, variations occur in the Z axis direction in the exposure range in the photoresist film 91. As a result, the exposure range in the photoresist film 91 is gradually widened from the side close to the seed layer 60 toward the far side. Consequently, in the photoresist pattern 111 formed finally, the width (opening width) of the openings 111K1 and 111K2 decreases gradually toward the seed layer 60.

In this case, particularly, the reflection suppression layer 170 is disposed in the inner area F1R and the outer area F1L on the seed layer 60 but is not disposed in the inner area F2R and the outer area F2L. Therefore, the exposure range in the photoresist film 91 relatively varies according to the presence or absence of the reflection suppression layer 170 between the inner area F1R and the outer area F1L and the inner area F2R and the outer area F2L. Concretely, light is not relatively reflected irregularly in the inner area F1R and the outer area F1L and tends to be relatively easily reflected irregularly in the inner area F2R and the outer area F2L, so that the exposure range in the photoresist film 91 in the inner area F1R and the outer area F1L becomes narrower than that in the inner area F2R and the outer area F2L. By utilizing the relative difference of the exposure ranges, as shown in FIG. 21, an inclination angle ωR1 of an inner-side defining face 111R1M (a first inner-side defining face) defining the opening 111K1 in the inner frame part 111R1 and an inclination angle ωL1 of an outer-side defining face 111L1M (a first outer-side defining face) defining the opening 111K1 in the outer frame part 111L1 are made different from an inclination angle ωR2 of an inner-side defining face 111R2M (a second inner-side defining face) defining the opening 111K2 in the inner frame part 111R2 and an inclination angle ωL2 of an outer-side defining face 111L2M (a second outer-side defining face) defining the opening 111K2 in the outer frame part 111L2. Concretely, the inclination angles ωR1 and ωL1 are larger than the inclination angles ωR2 and ωL2 (ωR1, 107 L1>ωR2, ωL2). For the reason described in the foregoing first embodiment, in FIGS. 20 and 21 and FIG. 22 and subsequent diagrams to be described later, the inner-side defining faces 111R1M and 111R2M and the outer-side defining faces 111L1M and 111L2M are shown as flat faces.

Figure 22:
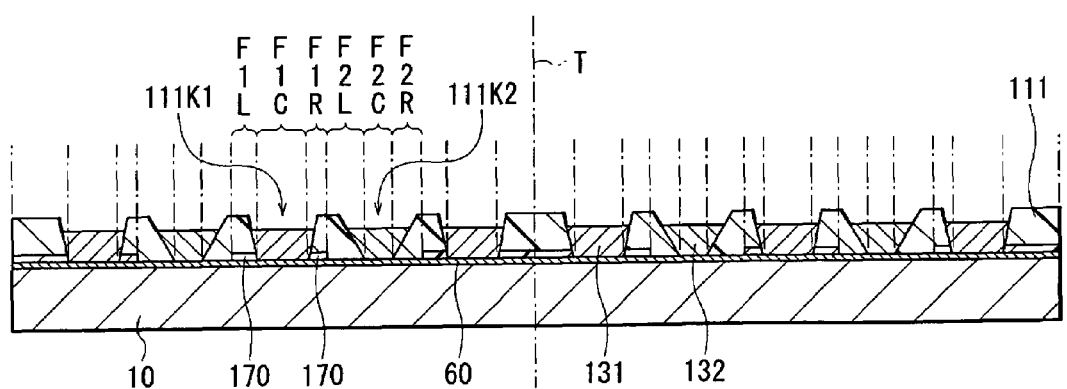
FIG. 22 is a cross section for explaining a process subsequent to FIG. 20.

Subsequently, as shown in FIG. 22, the coil pattern 131 is formed in the opening 111K1 in the photoresist pattern 111 and, similarly, the coil pattern 132 is formed in the opening 111K2. At the time of forming the coil patterns 131 and 132, for example, by growing a plating film by using the seed layer 60, the coil patterns 131 and 132 are formed. In particular, at the time of forming the coil patterns 131 and 132, it is preferable to adjust the thickness of the coil patterns 131 and 132 so as to be smaller than the thickness of the photoresist pattern 111. As shown in FIGS. 15 and 16, the coil pattern 131 is formed so as to have an inverted trapezoid shape in cross section which is bilaterally symmetrical, including the side 131E1 positioned on the side far from the seed layer 60 and specifying the inner-side base angle θR1 corresponding to the inner area F1R and the outer-side base angle θL1 corresponding to the outer area F1L as a longer one of a set of opposite sides which are parallel to each other, and the other side 131E2 positioned on the side close to the seed layer 60 as a shorter one of the set of opposite sides. The inner-side base angle θR1 and the outer-side base angle θL1 are equal to each other. Similarly, the coil pattern 132 has an inverted trapezoid shape in cross section which is bilaterally symmetrical including the side 132E1 positioned on the side far from the seed layer 60 and specifying the inner-side base angle θR2 corresponding to the inner area F2R and the outer-side base angle θL2 corresponding to the outer area F2L as a longer one of the set of opposite sides which are parallel to each other, and the other side 132E2 positioned on the side close to the seed layer 60 as a shorter one of the set of opposite sides. The inner-side base angle θR2 and the outer-side base angle θL2 are equal to each other, and the inner-side base angle θR1 and the outer-side base angle θL1 are different from each other. For example, in the sections of the coil patterns 131 and 132, the inner-side base angle θR1 and the outer-side base angle θL1 are larger than the inner-side base angle θR2 and the outer-side base angle θL2 (θR1, θL1>θR2, θL2).

Figure 23:
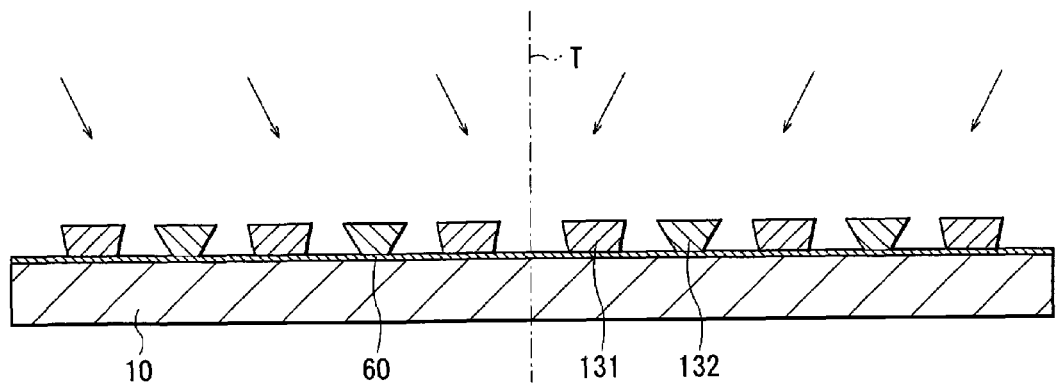
FIG. 23 is a cross section for explaining a process subsequent to FIG. 22.

Subsequently, by dissolving the reflection suppression layer 170 and the photoresist pattern 111 by using an organic solvent such as acetone, as shown in FIG. 23, the reflectance suppression layer 170 and the photoresist pattern 111 are removed. By the operation, the seed layer 60 is exposed in the positions where the reflectance suppression layer 170 and the photoresist pattern 111 were provided.

Figure 24:
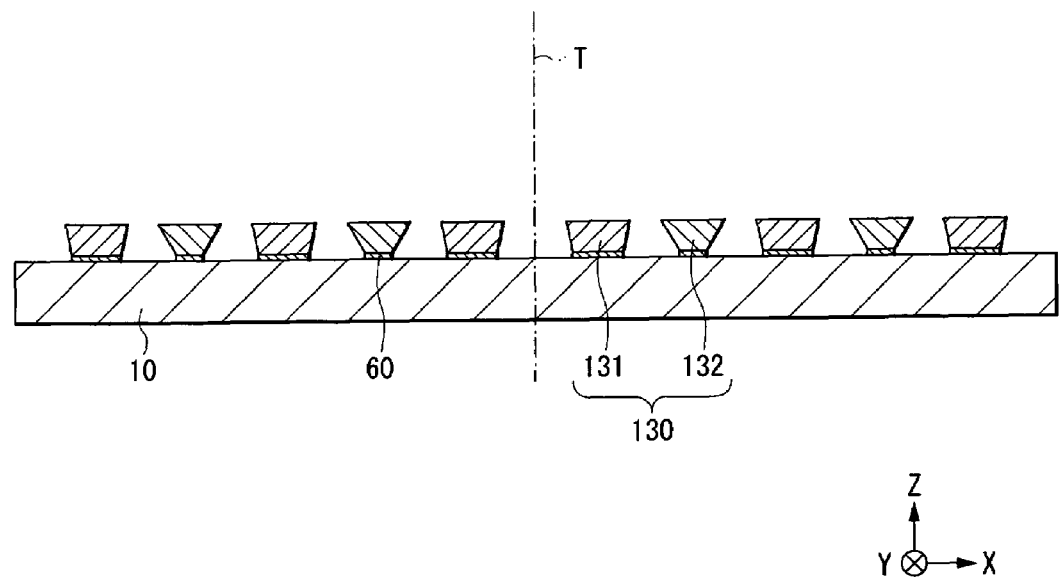
FIG. 24 is a cross section for explaining a process subsequent to FIG. 23.

Finally, both of the coil patterns 131 and 132 are used as a mask and the seed layer 60 is selectively etched by using, for example, ion milling, thereby removing the seed layer 60 in the parts which are not covered with the coil patterns 131 and 132 to expose the bottom magnetic substrate 10 as shown in FIG. 24. In such a manner, the thin film coil 130 including the coil patterns 131 and 132 which are parallel to each other and are turned spirally around the center position T is completed on the bottom magnetic substrate 10.

In the method of manufacturing the common mode choke coil according to the embodiment, by patterning the photoresist film 91 by exposure in a state where the reflection suppression layer 170 is formed in the inner and outer areas F1R and F1L, the photoresist pattern 111 is formed in such a manner that the width of each of the openings 111K1 and 111K2 gradually decreases toward the seed layer 60. After that, the coil patterns 131 and 132 are formed in the openings 111K1 and 111K2 in the photoresist pattern 111, thereby forming the thin film coil 130. In this case, as described above, because of the optical action that the exposure range in the photoresist film 91 in the inner and outer areas F1R and F1L is narrower than that in the inner and outer areas F2R and F2L in accordance with the presence or absence of the reflection suppression layer 170, the inclination angles ωR1 and ωL1 of the inner and outer frame parts 111R1 and 111L1 become larger than the inclination angles ωR2 and ωL2 of the inner and outer frame parts 111R2 and 111L2 in the photoresist pattern 111. Consequently, when the coil patterns 131 and 132 are formed in the openings 111K1 and 111K2, respectively, in the photoresist pattern 111, the relation of the inclination angles ωR1, ωL1, ωR2, and ωL2 is reflected and the inner-side and outer-side base angles θR1 and θL1 become larger than the inner-side and outer-side base angles θR2 and θL2. That is, both of the coil patterns 131 and 132 are formed so as to have an inverted trapezoid shape in cross section which is bilaterally symmetrical. Moreover, in this case, for forming the coil patterns 131 and 132 so as to have the section of the inverted trapezoid shape which is bilaterally symmetrical, only the existing thin film process such as the film forming technique, patterning technique, and etching technique is used and novel and complicated manufacturing processes are not used. Thus, the thin film coil 130 is easily formed by using only the existing thin film process. Therefore, in the embodiment, the thin film coil 130 can be easily formed so that the section of each of the coil patterns 131 and 132 becomes the inverted trapezoid shape which is bilaterally symmetrical. Thus, a common mode choke coil having the thin film coil 130 can be manufactured as easy as possible.

In addition to the above, in the method of manufacturing the thin film coil according to the embodiment, to form the thin film coil 130 in which the section of each of the coil patterns 131 and 132 has the inverted trapezoid shape which is bilaterally symmetrical, as described above, only the existing thin film process is used and novel and complicated manufacturing processes are not used. Therefore, in the embodiment, the thin film coil 130 can be manufactured as easily as possible by using only the existing thin film process.

Figure 25:
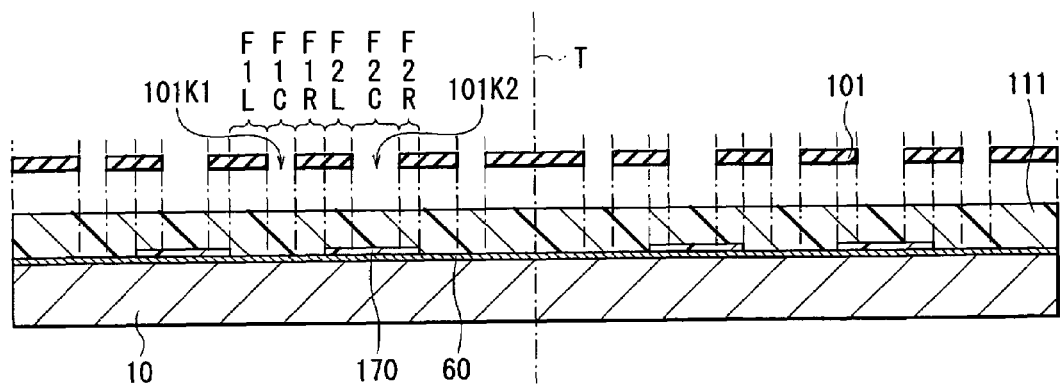
FIG. 25 is a cross section for explaining a modification of the method of manufacturing the common mode choke coil according to the second embodiment of the invention.
Figure 26:
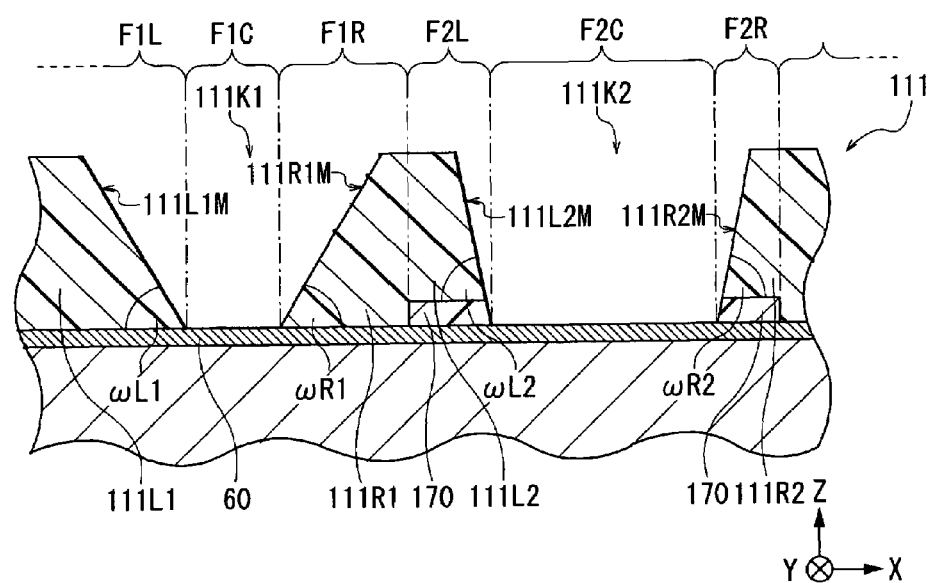
FIG. 26 is a cross section for explaining a process subsequent to FIG. 25.
Figure 27:
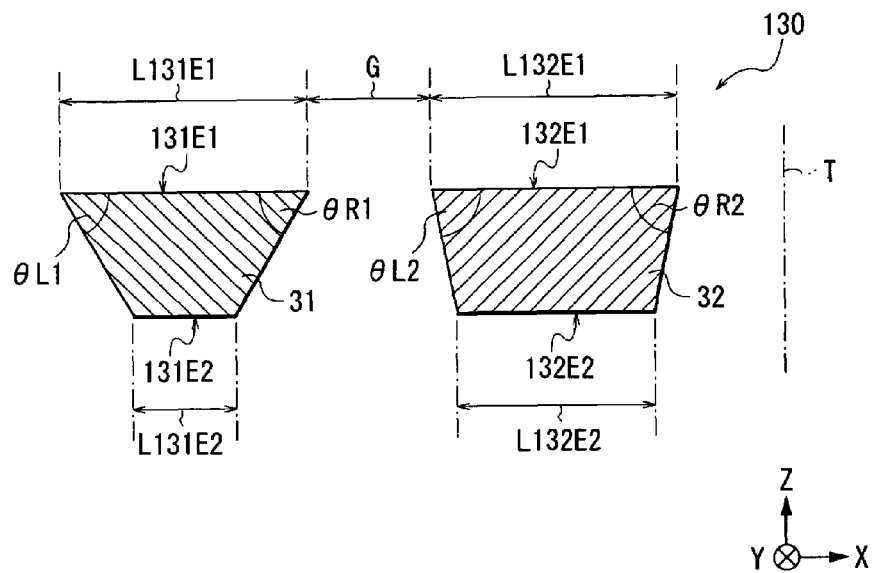
FIG. 27 is a cross section showing a sectional configuration of a thin film coil formed by using a photoresist pattern illustrated in FIG. 26.

In the embodiment, as shown in FIGS. 19 and 21, the photoresist film 91 is exposed and patterned. Consequently, at the time of forming the photoresist pattern 111, the reflection suppression layer 170 is disposed in the inner area F1R, the outer area F1L and the center area F1C, thereby making the inner-side base angle θR1 and the outer-side base angle θL1 larger than the inner-side base angle θR2 and the outer-side base angle θL2 in the sections of the coil patterns 131 and 132 (θR1, θL1>θR2, θL2) as shown in FIG. 16. However, the invention is not always limited to the arrangement. Concretely, for example, as shown in FIG. 25, by disposing the reflection suppression layer 170 in the inner area F2R, the outer area F2L, and the center area F1C in place of the inner area F1R, the outer area F1L, and the center area F1C, as shown in FIG. 26, in a manner similar to the case shown in FIGS. 19 and 21, the photoresist pattern 111 may be formed so that the inclination angles ωR2 and ωL2 become larger than the inclination angles ωR1 and ωL1 by using a relative difference in the exposure range on the basis of the presence/absence of the reflection suppression layer 170 (ωR1, ωL1<ωR2, ωL2). In this case, by forming the coil patterns 131 and 132 with the photoresist pattern 111 shown in FIG. 26, as shown in FIG. 27, the inner-side base angle θR2 and the outer-side base angle θL2 become larger than the inner-side base angle θR1 and the outer-side base angle θL1 in the sections of the coil patterns 131 and 132 (θR1, θL1<θR2, θL2). In this case as well, effects similar to those of the foregoing embodiment can be obtained. In particular, the values of the inner-side base angles θR1 and θR2 and the outer-side base angles θL1 and θL2 and the relations of the values can be freely set in accordance with, for example, the design specification of the common mode choke coil, the target performance, and the like.

The procedures, actions, and effects other than the above of the method of manufacturing the common mode choke coil according to the second embodiment are similar to those of the first embodiment.

Third Embodiment

A third embodiment of the invention will now be described.

Figure 28:
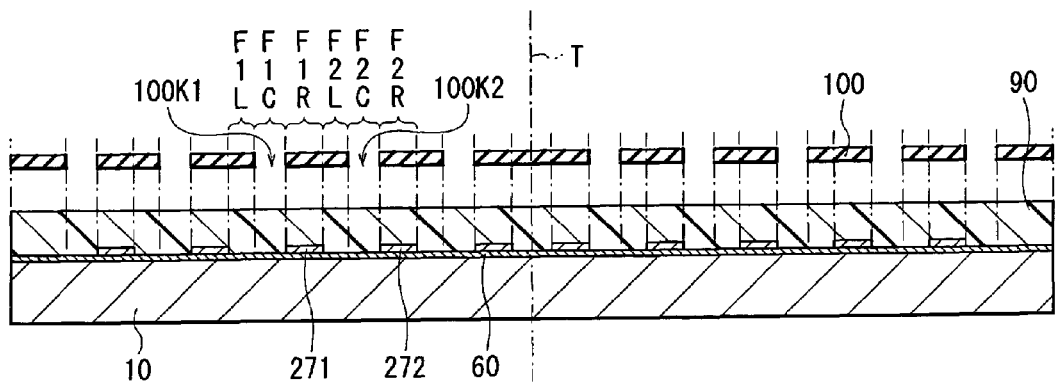
FIG. 28 is a cross section for explaining a process in a manufacturing process of the common mode choke coil according to the third embodiment of the invention.
Figure 29:
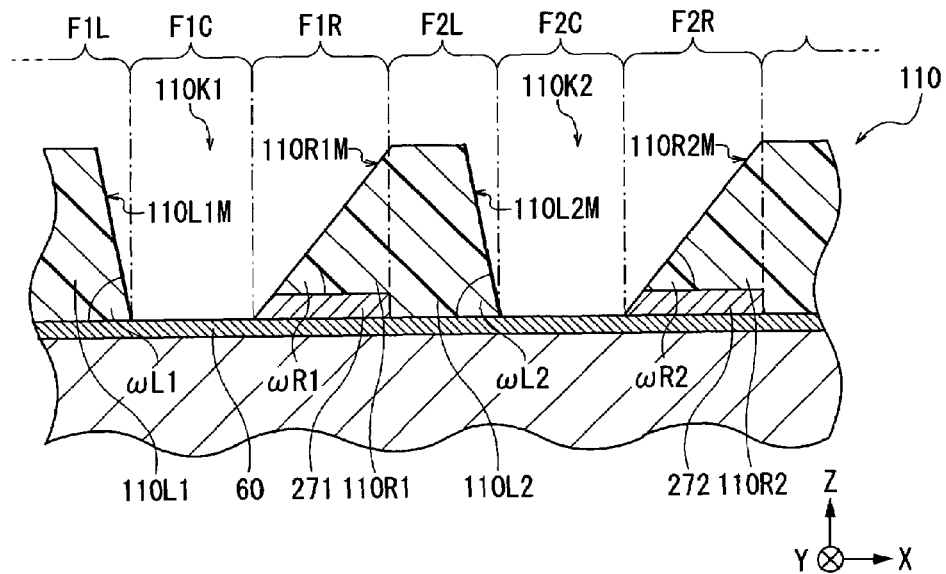
FIG. 29 is a cross section for explaining a process subsequent to FIG. 28.

FIGS. 28 and 29 are diagrams for explaining a process of manufacturing the common mode choke coil as the "method of manufacturing the coil structure" according to the third embodiment of the invention and correspond to FIGS. 6 and 8, respectively, which were referred to in the first embodiment. In the FIGS. 28 and 29, the same reference numerals are designated to the same components as those of the first embodiment. Since the "method of manufacturing a thin film coil" of the invention is a used to form the thin film coil 30 (the coil patterns 31 and 32) in a process of manufacturing the common mode choke coil according to a third embodiment, the method will be also described below.

In the method of manufacturing the common mode choke coil according to the third embodiment, the thin film coil 30 (the coil patterns 31 and 32) is formed by a forming process (refer to FIGS. 4 to 11) which is similar to the manufacturing process of the first embodiment except for the point that reflection promotion layers 271 and 272 for promoting the reflecting phenomenon at the time of exposure are used in place of the reflection suppression layers 71 and 72 as the exposure control layers different from the first embodiment using the reflection suppression layers 71 and 72 for suppressing the reflecting phenomenon at the time of exposure as the exposure control layers in order to form the thin film coil 30 in which each of the coil patterns 31 and 32 shown in FIGS. 1 to 3 has a section having an inverted trapezoid shape which is bilaterally asymmetrical.

At the time of forming the thin film coil 30 (the coil patterns 31 and 32) in the process of manufacturing the common mode choke coil according to the third embodiment, the seed layer 60 is formed on the bottom magnetic substrate 10 by a procedure similar to the procedure described by referring to FIG. 4 in the foregoing first embodiment. After that, as shown in FIG. 28, an exposure control layer for controlling the progress of the exposing process is formed on the seed layer 60. In this case, for example, by forming a film by using a material having a high light reflection characteristic on the seed layer 60, as described above, the reflection promotion layers 271 and 272 for promoting the reflection phenomenon at the time of exposure are formed in patterns as the exposure control layers. At the time of forming the reflection promotion layers 271 and 272, for example, a material having the light reflection characteristic higher than that of the seed layer 60 is used. Concretely, in the case where the seed layer 60 is made of a color metal material such as copper (Cu), a metal material having a low light absorption characteristic (for example, silver (Ag), platinum (Pt), or the like having high white glossiness) is used. In particular, in the case of forming the reflection promotion layers 271 and 272, for example, by using a film forming method such as sputtering, the reflection promotion layers 271 and 272 are disposed in the inner areas F1R and F2R or the outer areas F1L and F2L. In this case, for example, the reflection promotion layer 271 (the first exposure control layer) is disposed in the inner area F1R, and the reflection promotion layer 272 (the second exposure control layer) is disposed in the inner area F2R. The areas (the inner areas F1R and F2R or the outer areas F1L and F2L) in which the reflection promotion layers 271 and 272 are to be disposed are selected on the basis of the shapes of the sections of the coil patterns 31 and 32 shown in FIG. 3 (the magnitude relation between the inner-side base angles θR1 and θR2 and the outer-side base angles θL1 and θL2). To be specific, the reflection promotion layers 271 and 272 are disposed in the areas corresponding to the base angles desired to be relatively smaller, which are either the inner-side base angles θR1 and θR2 corresponding to the inner areas F1R and F2R or the outer-side base angles θL1 and θL2 corresponding to the outer areas F1L and F2L. In this case, as an example, to set the shapes of the section of the coil patterns 31 and 32 so that the inner-side base angles θR1 and θR2 become smaller than the outer-side base angles θL1 and θL2, the reflection promotion layers 271 and 272 are disposed in the inner areas F1R and F2R corresponding to the inner-side base angles θR1 and θR2.

Subsequently, a photoresist is applied on the surfaces of the seed layer 60 and the reflection promotion layers 271 and 272 and, as necessary, heated/cooled, thereby forming the photoresist film 90 so as to cover the seed layer 60 and the reflection promotion layers 271 and 272 as shown in FIG. 28.

Subsequently, as shown in FIG. 28, the mask 100 provided with the openings 100K1 and 100K2 having the shapes corresponding to the shapes of the coil patterns 31 and 32 in positions corresponding to the center areas F1C and F2C, respectively, is prepared. After that, the photolithography process using the mask 100 is used and the photoresist film 90 is patterned so as to be adapted to the pattern shape of the mask 100. Concretely, the photoresist film 90 is selectively exposed via the mask 100. The exposed photoresist film 90 is heated/cooled as necessary and developed with a developing solution, that is, unnecessary parts (parts exposed via the openings 100K1 and 100K2 in the mask 100) in the photoresist film 90 are selectively removed. Particularly, at the time of patterning the photoresist film 90 by using the photolithography process, for example, by partially dry-etching the reflection promotion layers 271 and 272 as necessary, the unnecessary parts in the reflection promotion layers 271 and 272 are also removed. As a result, as shown in FIG. 29, the photoresist pattern 110 having the structural characteristic (ωR1, ωR2<ωL1, ωL2) similar to that in the case described with reference to FIG. 8 in the first embodiment is formed on the seed layer 60.

When the photoresist pattern 110 is formed by patterning the photoresist film 90 by using the photolithography process, as described in the first embodiment, variations occur in the Z axis direction in the exposure range in the photoresist film 90 due to the light irregular reflection phenomenon in the seed layer 60. As a result, the width (opening width) of the openings 110K1 and 110K2 decreases gradually toward the seed layer 60. In this case, particularly, the reflection promotion layers 271 and 272 are disposed in the inner areas F1R and F2R on the seed layer 60 but are not disposed in the outer areas F1L and F2L. Therefore, the exposure range in the photoresist film 90 relatively varies according to the presence or absence of the reflection promotion layers 271 and 272 between the inner areas F1R and F2R and the outer areas F1L and F2L. Concretely, light is relatively easily reflected irregularly in the inner areas F1R and F2R than the outer areas F1L and F2L, so that the exposure range in the photoresist film 90 in the inner areas F1R and F2R becomes wider than that in the outer areas F1L and F2L. Consequently, as shown in FIG. 29, the inclination angle ωR1 of the inner-side defining face 110R1M defining the opening 110K1 in the inner frame part 110R1 and the inclination angle ωL1 of the outer-side defining face 110L1M defining the opening 110K1 in the outer frame part 110L1 are different from each other (ωR1≠ωL1). The inclination angle ωR2 of the inner-side defining face 110R2M defining the opening 110K2 in the inner frame part 110R2 and the inclination angle ωL2 of the outer-side defining face 110L2M defining the opening 110K2 in the outer frame part 110L2 are different from each other (ωR2≠ωL2). Concretely, the inclination angle ωR1 becomes smaller than the inclination angle ωL1 (ωR1<ωL1), and the inclination angle ωR2 becomes smaller than the inclination angle ωL2 (ωR2<ωL2). Consequently, for example, as described above, in the case of forming the photoresist pattern 110 so that the inclination angle ωR1 becomes smaller than the inclination angle ωL1, and the inclination angle ωR2 becomes smaller than the inclination angle ωL2, as shown in FIG. 3, the inner-side base angle θR1 becomes smaller than the outer-side base angle θL1 (θR1<θL1), and the inner-side base angle θR2 becomes smaller than the outer-side base angle θL2 (θR2<θL2) in the sections of the coil patterns 31 and 32 finally formed.

Figure 11:
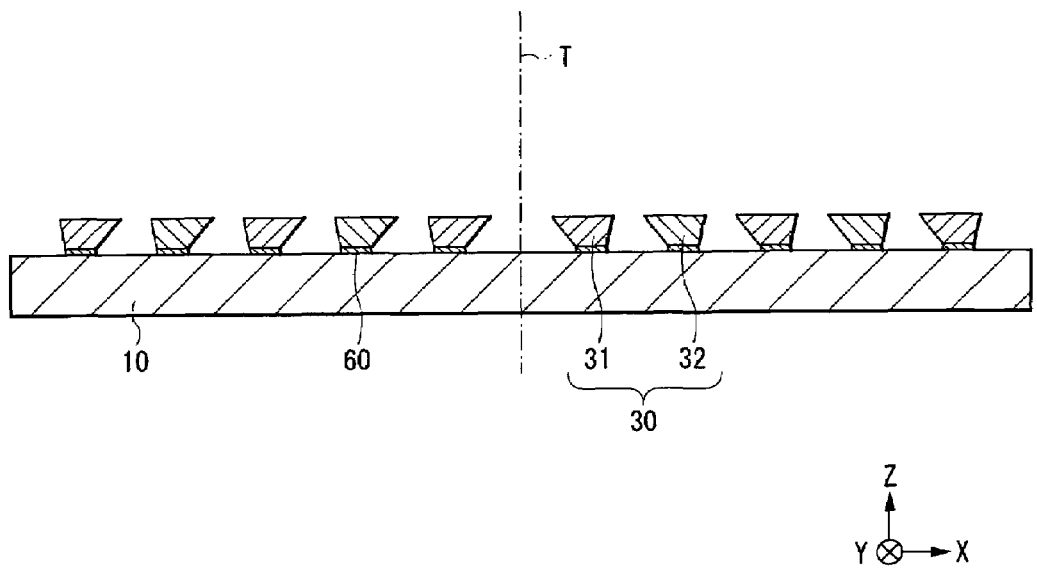
FIG. 11 is a cross section for explaining a process subsequent to FIG. 10.

Since the procedure of forming the photoresist pattern 110 and, after that, forming the coil patterns 31 and 32 by using the photoresist pattern 110, thereby forming the thin film coil 30 finally is similar to that described with reference to FIGS. 9 to 11 in the foregoing first embodiment, its description will not be repeated. In this case as well, the thin film coil 30 in which the section of each of the coil patterns 31 and 32 shown in FIGS. 1 to 3 has an inverted trapezoid shape which is bilaterally asymmetrical can be formed.

In the method of manufacturing the common mode choke coil according to the embodiment, by exposing and patterning the photoresist film 90 in a state where the reflection promotion layers 271 and 272 are formed in the inner areas F1R and F2R, respectively, the photoresist pattern 110 is formed so that the width of each of the openings 110K1 and 110K2 gradually decreases toward the seed layer 60 and, after that, the coil patterns 31 and 32 are formed by using the photoresist pattern 110. In this case, as described above, because of the optical action that the exposure range in the photoresist film 90 in the inner areas F1R and F2R expands relative to that in the outer areas F1L and F2L in accordance with the presence or absence of the reflection promotion layers 271 and 272, the inclination angles ωR1 and ωR2 of the inner frame parts 110R1 and 110R2 become smaller than the inclination angles ωL1 and ωL2 of the outer frame parts 110L1 and 110L2 in the photoresist pattern 110. Consequently, when the coil patterns 31 and 32 are formed by using the photoresist pattern 110, the magnitude relations among the inclination angles ωR1, ωL1, ωR2, and ωL2 are reflected and the inner-side base angles θR1 and θR2 become smaller than the outer-side base angles θL1 and θL2 in the sections of the coil patterns 31 and 32. That is, both of the coil patterns 31 and 32 are formed so as to have an inverted trapezoid shape in cross section which is bilaterally asymmetrical. Moreover, in this case, for forming the coil patterns 31 and 32 so as to have the section of the inverted trapezoid shape which is bilaterally asymmetrical, only the existing thin film process is used and novel and complicated manufacturing processes are not used. Therefore, also in the embodiment, the common mode choke coil having the thin film coil 30 can be formed as easily as possible by using only the existing thin film process.

Figure 30:
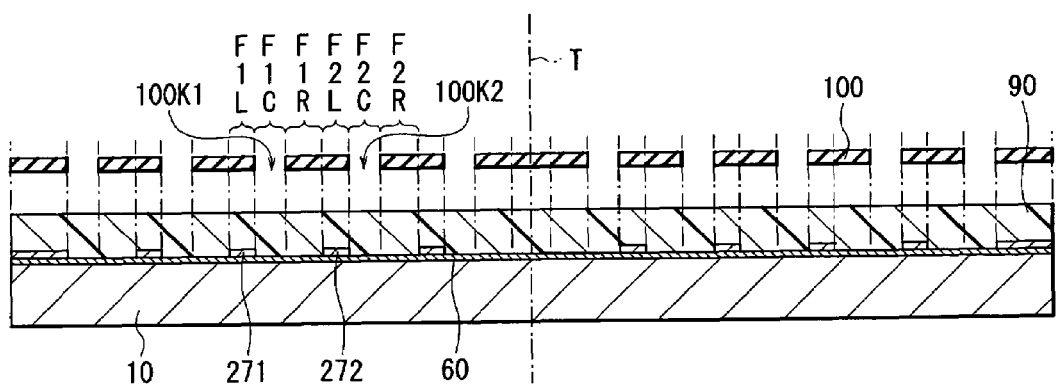
FIG. 30 is a cross section for explaining a modification of the method of manufacturing the common mode choke coil according to the third embodiment of the invention.
Figure 31:
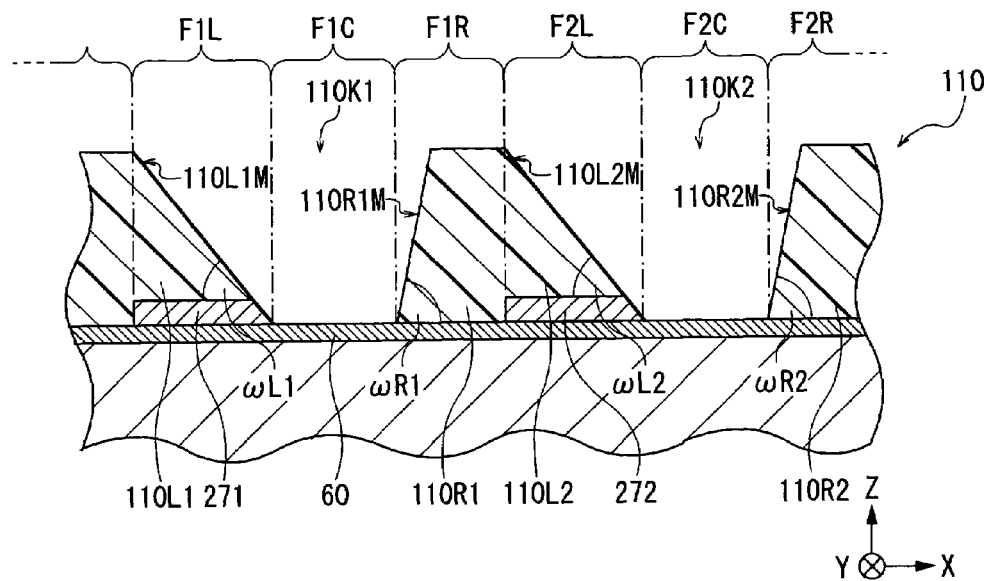
FIG. 31 is a cross section for explaining a process subsequent to FIG. 30.

In the embodiment, as shown in FIGS. 28 and 29, at the time of forming the photoresist pattern 110 by exposing and patterning the photoresist film 90, by disposing the reflection promotion layers 271 and 272 in the inner areas F1R and F2R, respectively, the inner-side base angles θR1 and θR2 become smaller than the outer-side base angles θL1 and θL2 in the sections of the coil patterns 31 and 32 (θR1, θR2>θL1, θL2) as shown in FIG. 3. However, the invention is not always limited to the arrangement. Concretely, for example, as shown in FIG. 30, by disposing the reflection promotion layers 271 and 272 in the outer areas F1L and F2L in place of the inner areas F1R and F2R, as shown in FIG. 31, in a manner similar to the case shown in FIGS. 28 and 29, the photoresist pattern 110 may be formed so that the inclination angles ωL1 and ωL2 become smaller than the inclination angles ωR1 and ωR2 by using a relative difference in the exposure range on the basis of the presence/absence of the reflection promotion layers 271 and 272 (ωR1, ωR2>ωL1, ωL2). In this case, by forming the coil patterns 31 and 32 with the photoresist pattern 110 shown in FIG. 31, as shown in FIG. 14 as a modification of the first embodiment, the outer-side base angles θL1 and θL2 become smaller than the inner-side base angles θR1 and θR2 in the sections of the coil patterns 31 and 32 (θR1, θR2>θL1, θL2). In this case as well, effects similar to those of the foregoing embodiment can be obtained.

The procedures, actions, and effects other than the above of the method of manufacturing the common mode choke coil and the method of manufacturing the thin film coil according to the third embodiment are similar to those of the first embodiment.

Fourth Embodiment

A fourth embodiment of the invention will now be described.

Figure 32:
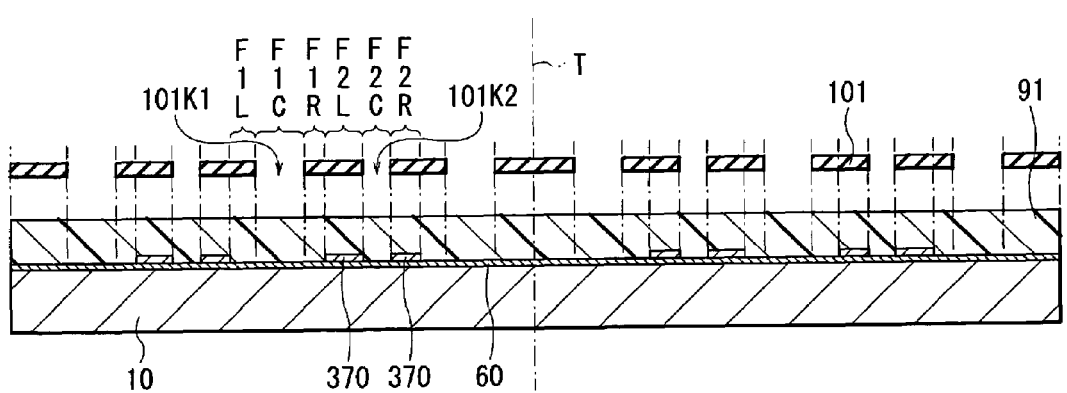
FIG. 32 is a cross section for explaining a process in a manufacturing process of a common mode choke coil according to a fourth embodiment of the invention.
Figure 33:
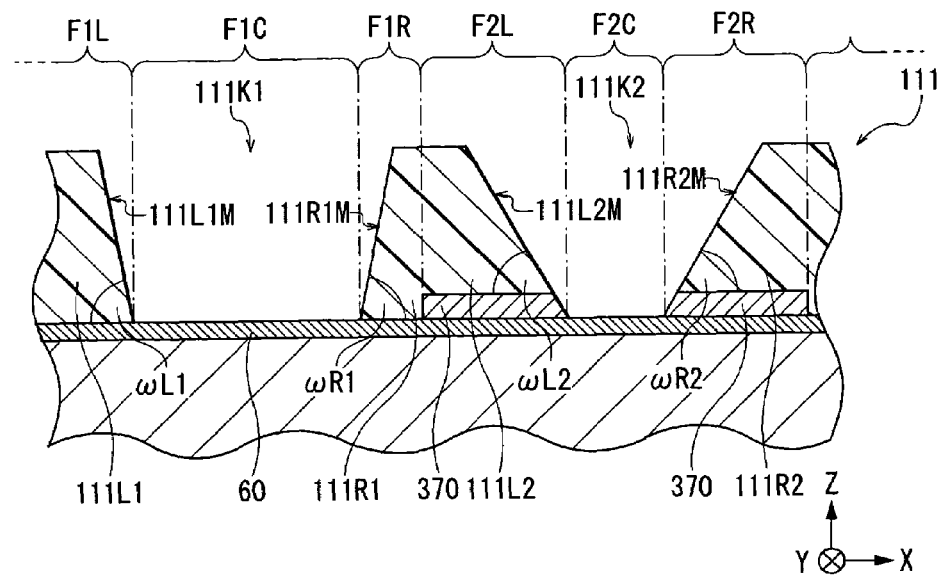
FIG. 33 is a cross section for explaining a process subsequent to FIG. 32.

FIGS. 32 and 33 are diagrams for explaining a process of manufacturing a common mode choke coil as the "method of manufacturing the coil structure" according to the fourth embodiment of the invention and correspond to FIGS. 19 and 21, respectively, which were referred to in the second embodiment. In the FIGS. 32 and 33, the same reference numerals are designated to the same components as those of the second embodiment. Since the "method of manufacturing a thin film coil" of the invention is used to form the thin film coil 130 (the coil patterns 131 and 132) in a process of manufacturing the common mode choke coil according to the fourth embodiment, the method of manufacturing the thin film coil will be also described below.

In the method of manufacturing the common mode choke coil according to the fourth embodiment, different from the second embodiment using the reflection suppression layer 170 for suppressing the reflecting phenomenon at the time of exposure as the exposure control layer in order to form the thin film coil 130 in which each of the coil patterns 131 and 132 shown in FIGS. 15 and 16 has a section having an inverted trapezoid shape which is bilaterally symmetrical, the thin film coil 130 (the coil patterns 131 and 132) is formed by a forming process (refer to FIGS. 17 to 24) which is similar to the manufacturing process of the second embodiment except for the point that a reflection promotion layer 370 for promoting the reflecting phenomenon at the time of exposure is used in place of the reflection suppression layer 170 as the exposure control layer.

At the time of forming the thin film coil 130 (the coil patterns 131 and 132) in the process of manufacturing the common mode choke coil according to the fourth embodiment, the seed layer 60 is formed on the bottom magnetic substrate 10 by a procedure similar to the procedure described by referring to FIG. 4 in the foregoing first embodiment. After that, as shown in FIG. 32, an exposure control layer for controlling the progress of the exposing process is formed on the seed layer 60. In this case, for example, by forming a film by using a material having a high light reflection characteristic on the seed layer 60, as described above, the reflection promotion layer 370 for promoting the reflection phenomenon at the time of exposure is formed in a pattern as the exposure control layer. The material and the procedure for forming the reflection promotion layer 370 are similar to those of the reflection promotion layers 271 and 272 described in the third embodiment. In particular, in the case of forming the reflection promotion layer 370, for example, by using a film forming method such as sputtering, the reflection promotion layer 370 is disposed in either the inner area F1R and the outer area F1L or the inner area F2R and the outer area F2L. In this case, for example, the reflection promotion layer 370 is disposed in the inner area F2R and the outer area F2L. The areas (the inner area F1R and the outer area F1L or the inner area F2R and the outer area F2L) in which the reflection promotion layer 370 is to be disposed are selected on the basis of the shapes of the sections of the coil patterns 131 and 132 shown in FIG. 16 (the magnitude relation between the inner-side base angle $\theta R1$ and the outer-side base angle $\theta L1$ and the inner-side base angle $\theta R2$ and the outer-side base angle $\theta L2$). To be specific, the reflection promotion layer 370 is disposed in the areas corresponding to the base angle desired to be relatively smaller, which are either the inner-side base angle $\theta R1$ corresponding to the inner area F1R and the outer-side base angle $\theta L1$ corresponding to the outer area F1L or the inner-side base angle $\theta R2$ corresponding to the inner area F2R and the outer-side base angles $\theta L2$ corresponding to the outer area F2L. In this case, as an example, to set the shapes of the sections of the coil patterns 131 and 132 so that the inner-side base angle $\theta R2$ and the outer-side base angle $\theta L2$ become smaller than the inner-side base angle $\theta R1$ and the outer-side base angle $\theta L1$, the reflection promotion layer 370 is disposed in the inner area F2R and the outer area F2C corresponding to the inner-side base angle $\theta R2$ and the outer-side base angle $\theta L2$, respectively.

Subsequently, a photoresist is applied on the surfaces of the seed layer 60 and the reflection promotion layer 370 and, as necessary, heated/cooled, thereby forming the photoresist film 91 so as to cover the seed layer 60 and the reflection promotion layers 370 as shown in FIG. 32.

Subsequently, as shown in FIG. 32, the mask 101 provided with the openings 101K1 and 100K2 having the shapes corresponding to the shapes of the coil patterns 131 and 132 in positions corresponding to the center areas F1C and F2C, respectively, is prepared. After that, the photolithography process using the mask 101 is used and the photoresist film 91 is patterned so as to be adapted to the pattern shape of the mask 101. Concretely, the photoresist film 91 is selectively exposed via the mask 101. The exposed photoresist film 91 is heated/cooled as necessary and developed with a developing solution, that is, unnecessary parts (parts exposed via the openings 101K1 and 101K2 in the mask 101) in the photoresist film 91 are selectively removed. Particularly, at the time of patterning the photoresist film 91 by using the photolithography process, for example, by partially dry-etching the reflection promotion layer 370 as necessary, the unnecessary parts in the reflection promotion layers 370 are also removed. As a result, as shown in FIG. 33, the photoresist pattern 111 having the structural characteristic ($\omega R1$, $\omega L1 < \omega R2$, $\omega L2$) similar to that in the case described with reference to FIG. 21 in the second embodiment is formed on the seed layer 60.

When the photoresist pattern 111 is formed by patterning the photoresist film 91 by using the photolithography process, as described in the second embodiment, variations occur in the Z axis direction in the exposure range in the photoresist film 91 due to the light irregular reflection phenomenon in the seed layer 60. As a result, the width (opening width) of the openings 111K1 and 111K2 decreases gradually toward the seed layer 60. In this case, particularly, the reflection promotion layer 370 is not disposed in the inner area F1R and the outer area F1L on the seed layer 60 but is disposed in the inner area F2R and the outer area F2L. Therefore, the exposure range in the photoresist film 91 relatively varies according to the presence or absence of the reflection promotion layer 370 between the inner area F1R and the outer area F1L and the inner area F2R and the outer area F2L. Concretely, light is reflected irregularly in the inner area F2R and the outer area F2L more easily relative to the inner area F1R and the outer area F1L, so that the exposure range in the photoresist film 91 in the inner area F2R and the outer area F2L becomes wider than that in the inner area F1R and the outer area F1L. Consequently, the inclination angle $\omega R1$ of the inner-side defining face 111R1M defining the opening 111K1 in the inner frame part 111R1 and the inclination angle $\omega L1$ of the outer-side defining face 111L1M defining the opening 111K1 in the outer frame part 111L1 match each other ($\omega R1 = \omega L1$). The inclination angle $\omega R2$ of the inner-side defining face 111R2M defining the opening 111K2 in the inner frame part 111R2 and the inclination angle $\omega L2$ of the outer-side defining face 111L2M defining the opening 111K2 in the outer frame part 111L2 match each other ($\omega R2 = \omega L2$). Consequently, for example, as described above, in the case of forming the photoresist pattern 111 so that the inclination angles $\omega R2$ and $\omega L2$ become smaller than the inclination angles $\omega R1$ and $\omega L1$ ($\omega R1$, $\omega L1 > \omega R2$, $\omega L2$), as shown in FIG. 16, the inner-side base angle $\theta R2$ and the outer-side base angle $\theta L2$ become smaller than the inner-side base angle $\theta R1$ and the outer-side base angle $\theta L1$ ($\theta R1$, $\theta L1 > \theta R2$, $\theta L2$) in the sections of the coil patterns 131 and 132 finally formed.

Since the procedure of forming the photoresist pattern 111 and, after that, forming the coil patterns 131 and 132 by using the photoresist pattern 111, thereby forming the thin film coil 130 finally is similar to that described with reference to FIGS. 22 to 24 in the foregoing second embodiment, its description will not be repeated. In this case as well, the thin film coil 130 in which the section of each of the coil patterns 131 and 132 shown in FIGS. 15 and 16 has an inverted trapezoid shape which is bilaterally asymmetrical can be formed.

In the method of manufacturing the common mode choke coil according to the embodiment, by exposing and patterning the photoresist film 91 in a state where the reflection promotion layer 370 is formed in the inner area F2R and the outer area F2L, the photoresist pattern 111 is formed so that the width of each of the openings 111K1 and 111K2 gradually decreases toward the seed layer 60 and, after that, the coil patterns 131 and 132 are formed by using the photoresist pattern 111. In this case, as described above, because of the optical action that the exposure range in the photoresist film 91 in the inner area F2R and the outer area F2L expands more than that in the inner area F1R and the outer area F1L in accordance with the presence or absence of the reflection promotion layer 370, the inclination angles ωR2 and ωL2 of the inner frame part 111R2 and the outer frame part 111L2 become smaller than the inclination angles ωR1 and ωL1 of the inner frame part 111R1 and the outer frame part 111L1 in the photoresist pattern 111. Consequently, when the coil patterns 131 and 132 are formed by using the photoresist pattern 111, the magnitude relations among the inclination angles ωR1, ωL1, ωR2, and ωL2 are reflected and the inner-side base angle θR2 and the outer-side base angle θL2 become smaller than the inner-side base angle θR1 and the outer-side base angle θL1 in the sections of the coil patterns 131 and 132. That is, both of the coil patterns 131 and 132 are formed so as to have an inverted trapezoid shape in cross section which is bilaterally symmetrical. Moreover, in this case, for forming the coil patterns 131 and 132 so as to have the section of the inverted trapezoid shape which is bilaterally symmetrical, only the existing thin film process is used and novel and complicated manufacturing processes are not used. Therefore, also in the embodiment, the common mode choke coil having the thin film coil 130 can be formed as easily as possible by using only the existing thin film process.

Figure 34:
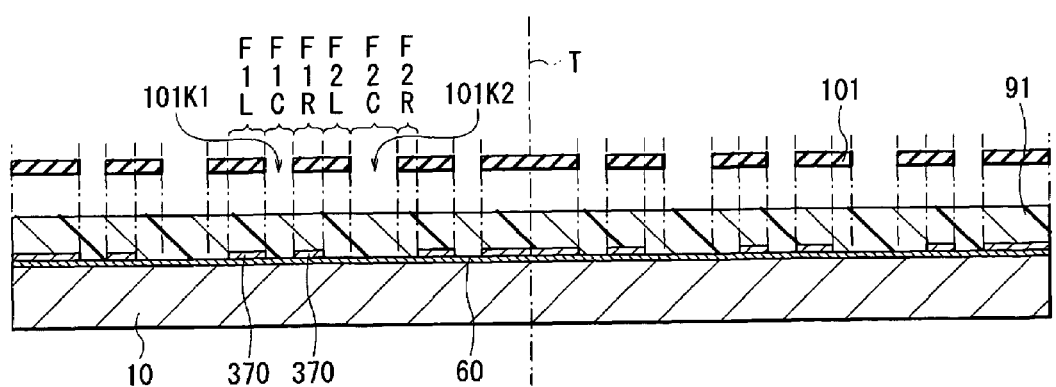
FIG. 34 is a cross section for explaining a modification of the method of manufacturing the common mode choke coil according to the fourth embodiment of the invention.
Figure 35:
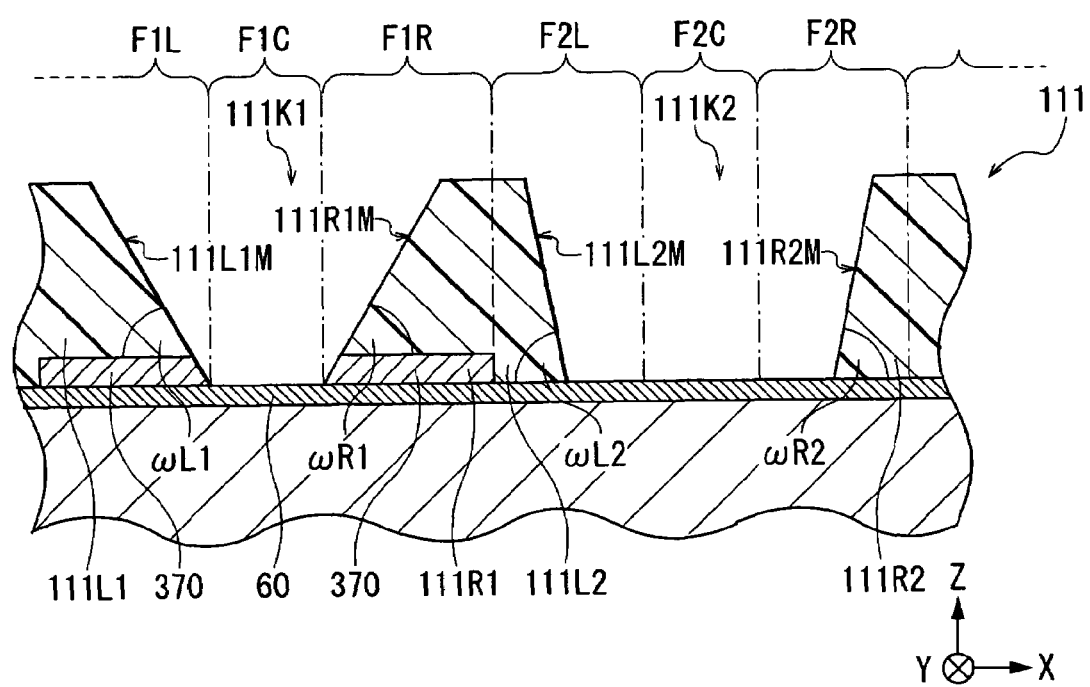
FIG. 35 is a cross section for explaining a process subsequent to FIG. 34.

In the embodiment, as shown in FIGS. 32 and 33, at the time of forming the photoresist pattern 111 by exposing and patterning the photoresist film 91, by disposing the reflection promotion layer 370 in the inner area F2R and the outer area F2L, the inner-side base angle θR2 and the outer-side base angle θL2 become smaller than the inner-side base angle θR1 and the outer-side base angle θL1 in the sections of the coil patterns 131 and 132 (θR1, θL1>θR2, θL2) as shown in FIG. 16. However, the invention is not always limited to the arrangement. Concretely, for example, as shown in FIG. 34, by disposing the reflection promotion layer 370 in the inner area F1R and the outer area F1L in place of the inner area F2R and the outer area F2L, as shown in FIG. 35, in a manner similar to the case shown in FIGS. 32 and 33, the photoresist pattern 111 may be formed so that the inclination angles ωR1 and ωL1 become smaller than the inclination angles ωR2 and ωL2 by using a relative difference in the exposure range on the basis of the presence/absence of the reflection promotion layer 370 (ωR1, ωL1>ωR2, ωL2). In this case, by forming the coil patterns 131 and 132 with the photoresist pattern 111 shown in FIG. 35, as shown in FIG. 27 as a modification of the second embodiment, the inner-side base angle θR1 and the outer-side base angle θL1 become smaller than the inner-side base angle θR2 and the outer-side base angle θL2 in the sections of the coil patterns 131 and 132 (θR1, θL1<θR2, θL2). In this case as well, effects similar to those of the foregoing embodiment can be obtained.

The procedures, actions, and effects other than the above of the method of manufacturing the common mode choke coil and the method of manufacturing the thin film coil according to the fourth embodiment are similar to those of the second embodiment.

The invention has been described above by the embodiments. The invention is not limited to the foregoing embodiments but can be variously modified. Concretely, for example, in the first and third embodiments, the shapes of the sections of the two coil patterns 31 and 32 match each other. More concretely, the section of each of the coil patterns 31 and 32 is an inverted trapezoid which is bilaterally asymmetrical. In the second and fourth embodiments, the shapes of the sections the two coil patterns 131 and 132 are different from each other. More concretely, the section of each of the coil patterns 131 and 132 is an inverted trapezoid which is bilaterally symmetrical. The invention, however, is not always limited to the shapes. As long as the differential transmission characteristic can be improved by reducing the capacitance as much as possible on the basis of the structural characteristic that the section of each of the two coil patterns is the inverted trapezoid, the combination of the shapes of the sections of the two coil patterns can be freely changed. Concretely, for example, in the case of the first and third embodiments in which the shapes of the sections of the two coil patterns match each other, the combination of the shapes of the sections of the two coil patterns is not limited to a combination of the inverted trapezoid shapes which are bilaterally asymmetrical, but may be, for example, a combination of the inverted trapezoid shapes which are bilaterally symmetrical. In the case of the second and fourth embodiments in which the shapes of the sections of the two coil patterns are different from each other, the combination of the shapes of the sections of the two coil patterns is not limited to the combination of the inverted trapezoid shapes which are bilaterally symmetrical, but may be, for example, the combination of the inverted trapezoid shapes which are bilaterally asymmetrical or the combination of the inverted trapezoid shape which is bilaterally symmetrical and the inverted trapezoid shape which is bilaterally asymmetrical. Effects similar to those of the foregoing embodiments can be obtained even when the shapes of the sections of two coil patterns have any of the combinations of the inverted trapezoid shapes.

Although the case of applying the invention to the common mode choke coil has been described in each of the foregoing embodiments, the invention is not limited to the case. The invention may be also applied to electronic parts other than the common mode choke coil. In this case as well, effects similar to those of the foregoing embodiments can be obtained.

The thin film coil according to the invention and the method of manufacturing the thin film coil can be applied to a coil structure such as a common mode choke coil and a method of manufacturing the coil structure.

Obviously many modifications and variations of the present invention are possible in the light of the above teachings. It is therefore to be understood that within the scope of the appended claims, the invention may be practiced otherwise than as specifically described.

What is claimed is:

1. A thin film coil including a first coil pattern and a second coil pattern which are provided on a predetermined underlayer and turn spirally in parallel with each other around a predetermined center position,
   wherein the first coil pattern and the second coil pattern exist separately and are provided on the same level,
   each of a section of the first coil pattern and a section of the second coil pattern has a trapezoid shape having one side positioned on the side far from the underlayer and specifying two base angles as a longer one of a set of opposite sides which are parallel to each other and the other side positioned on the side close to the underlayer as a shorter one of the set of opposite sides,
   wherein a shape of the section of the first coil pattern and a shape of the section of the second coil pattern match each other in an arbitrary turn position, wherein a first inner-side base angle positioned on the side close to the center position and a first outer-side base angle positioned on the side far from the center position out of the two base angles are different from each other in the section of the first coil pattern, and a second inner-side base angle positioned on the side close to the center position and a second outer-side base angle positioned on the side far from the center position out of the two base angles are different from each other in the section of the second coil pattern.

2. A thin film coil according to claim 1, wherein the first outer-side base angle is larger than the first inner-side base angle in the section of the first coil pattern, and the second outer-side base angle is larger than the second inner-side base angle in the section of the second coil pattern.

3. A thin film coil including a first coil pattern and a second coil pattern which are provided on a predetermined underlayer and turn spirally in parallel with each other around a predetermined center position, wherein the first coil pattern and the second coil pattern exist separately and are provided on the same level, and each of a section of the first coil pattern and a section of the second coil pattern has a trapezoid shape having one side positioned on the side far from the underlayer and specifying two base angles as a longer one of a set of opposite sides which are parallel to each other and the other side positioned on the side close to the underlayer as a shorter one of the set of opposite sides, wherein a shape of the section of the first coil pattern and a shape of the section of the second coil pattern are different from each other in an arbitrary turn position, wherein a first inner-side base angle positioned on the side close to the center position and a first outer-side base angle positioned on the side far from the center position out of the two base angles match each other in the section of the first coil pattern, and wherein a second inner-side base angle positioned on the side close to the center position and a second outer-side base angle positioned on the side far from the center position out of the two base angles match each other in the section of the second coil pattern.

4. A coil structure in which a thin film coil is buried between two magnetic substrates via an insulating layer, wherein the thin film includes a first coil pattern and a second coil pattern which are provided on a predetermined underlayer and turn spirally in parallel with each other around a predetermined center position, the first coil pattern and the second coil pattern exist separately and are provided on the same level, each of a section of the first coil pattern and a section of the second coil pattern has a trapezoid shape having one side positioned on the side far from the underlayer and specifying two base angles as a longer one of a set of opposite sides which are parallel to each other and the other side positioned on the side close to the underlayer as a shorter one of the set of opposite sides, wherein a shape of the section of the first coil pattern and a shape of the section of the second coil pattern match each other in an arbitrary turn position, wherein a first inner-side base angle positioned on the side close to the center position and a first outer-side base angle positioned on the side far from the center position out of the two base angles are different from each other in the section of the first coil pattern, and a second inner-side base angle positioned on the side close to the center position and a second outer-side base angle positioned on the side far from the center position out of the two base angles are different from each other in the section of the second coil pattern.

5. A coil structure in which a thin film coil is buried between two magnetic substrates via an insulating layer, wherein the thin film includes a first coil pattern and a second coil pattern which are provided on a predetermined underlayer and turn spirally in parallel with each other around a predetermined center position, the first coil pattern and the second coil pattern exist separately and are provided on the same level, and each of a section of the first coil pattern and a section of the second coil pattern has a trapezoid shape having one side positioned on the side far from the underlayer and specifying two base angles as a longer one of a set of opposite sides which are parallel to each other and the other side positioned on the side close to the underlayer as a shorter one of the set of opposite sides, wherein a first inner-side base angle positioned on the side close to the center position and a first outer-side base angle positioned on the side far from the center position out of the two base angles match each other in the section of the first coil pattern, wherein a second inner-side base angle positioned on the side close to the center position and a second outer-side base angle positioned on the side far from the center position out of the two base angles match each other in the section of the second coil pattern, and wherein a shape of the section of the first coil pattern and a shape of the section of the second coil pattern are different from each other in an arbitrary turn position.

* * * * *